United States Patent [19]

Fujishima et al.

[11] Patent Number: 4,914,632

[45] Date of Patent: Apr. 3, 1990

[54] SEMICONDUCTOR DEVICES HAVING REDUNDANCY CIRCUITRY AND OPERATING METHOD THEREFOR

[75] Inventors: Kazuyasu Fujishima; Yoshio Matsuda; Mikio Asakura, all of Hyogo, Japan

[73] Assignee: Mitsubishi Denki Kabushiki Kaisha, Tokyo, Japan

[21] Appl. No.: 271,492

[22] Filed: Nov. 15, 1988

[30] Foreign Application Priority Data

Mar. 8, 1988 [JP] Japan .................................. 63-55250

[51] Int. Cl.$^4$ ............................................. G11C 11/34
[52] U.S. Cl. .................................... 365/200; 365/201
[58] Field of Search .................. 365/200, 201; 371/10, 371/11, 21

[56] References Cited

U.S. PATENT DOCUMENTS

| | | | |
|---|---|---|---|
| 4,494,220 | 11/1982 | Dumbri et al. ...................... | 365/200 |
| 4,641,286 | 2/1984 | Shimotori et al. ............. | 365/230.06 |
| 4,658,379 | 10/1984 | Fujishima et al. ................. | 365/200 |
| 4,694,432 | 3/1985 | Miyatake et al. .................. | 365/203 |

FOREIGN PATENT DOCUMENTS 62-92200 8/1986 Japan .

OTHER PUBLICATIONS

R. Cenker, "A Fault-Tolerant 64K Dynamic Random-Access Memory", IEEE Transactions on Electron Devices, vol. ED-26, No. 6, Jun. 1979.

*Primary Examiner*—Joseph A. Popek
*Attorney, Agent, or Firm*—Lowe, Price, LeBlanc, Becker & Shur

[57] ABSTRACT

A plurality of word drivers are provided corresponding to a plurality of word lines. A switch band is provided between the plurality of word drivers and a plurality of row decoders. Each row decoder is connected to four word drivers through the switch band. The state of connection between each of the row decoders and the word driver can be changed by the switch band. A spare row decoder, four word drivers and four spare word lines are provided. Any of the row decoders can be replaced with the spare row decoder. Consequently, four spare word driver and four spare word lines can be selected instead of the four word drivers and four word lines connected to the row decoder.

18 Claims, 18 Drawing Sheets

SEMICONDUCTOR DEVICES HAVING REDUNDANCY CIRCUITRY AND OPERATING METHOD THEREFOR

BACKGROUND OF THE INVENTION

1. Field of the Invention

The invention relates generally to semiconductor devices, and more particularly, toward redundancy circuits within programmable arrays of semiconductor devices and operating methods therefor. The invention is particularly useful for providing circuit redundancy within semiconductor memory arrays.

2. Description of the Prior Art

FIG. 1 is a block diagram showing a structure of a conventional semiconductor memory device provided with a redundant circuit. FIG. 1 shows an example of a 64K bit-dynamic random access memory (DRAM) having eight inputs $A_0$ to $A_7$ as address inputs. The redundant circuit is a spare circuit for improving the production yield, comprising a spare memory cell, a spare decoder and so on.

Referring to FIG. 1, the memory cell array 1 comprises a plurality of memory cells arranged in a plurality of rows and columns. The memory cell array 1 comprises a spare row 2 constituted by spare memory cells arranged in a plurality of rows and a spare column 3 constituted by spare memory cells arranged in a plurality of columns. A plurality of word lines are provided corresponding to the plural rows of the memory cell array 1 and a plurality of bit lines are provided corresponding to the plural columns of the same.

Meanwhile, a $\overline{RAS}$ buffer 4 activates a row address buffer 5, $\overline{\phi_p}$ generation circuit 6, $\phi_x$ generation circuit 7 and a sense amplifier control circuit 8 in response to an externally applied row address strobe signal $\overline{RAS}$. The $\overline{\phi_p}$ generation circuit 6 and the $\phi_x$ generation circuit 7 generate a precharge signal $\overline{\phi_p}$ and a driving signal $\phi_x$ at prescribed timings, respectively. The row address buffer 5 latches externally applied address signals $A_0$ to $A_7$ and applies a part of the signals as row address signals $RA_2$ to $RA_7$ to the row predecoder 9 and applies the remainder as row address signals $RA_0$ to $RA_1$ to the $\phi_x$ subdecoder 10. The row predecoder 9 predecodes row address signals $RA_2$ to $RA_7$ applied from the row address buffer 5 and applies row selection signals $X_i$, $X_j$ and $X_k$ to the row decode group 11 and to the spare row decoder 12. The row decoder group 11 selects four rows in the memory cell array 1 in response to the row selection signals $X_i$, $X_j$ and $X_k$. The $\phi_x$ subdecoder 10 applies subdecode signals $\phi_{x1}$ to $\phi_{x4}$ to the word driver group 13 in response to the driving signal $\phi_x$ from the $\phi_x$ generation circuit 7 based on the row address signals $RA_0$ to $RA_1$ applied from the row address buffer 5. The word driver group 13 drives word lines for one row out of the four rows selected by the row decoder group 11 or by the spare row decoder 12 in response to the subdecode signals $\phi_{x1}$ to $\phi_{x4}$. The sense amplifier control circuit 8 operates the sense amplifier group 14 at a prescribed timing. The sense amplifier group 14 amplifies the information on each bit line.

Meanwhile, the $\overline{CAS}$ buffer 15 activates a column address buffer 16 and a read/write buffer 17 in response to an externally applied column address strobe signal $\overline{CAS}$. The column address buffer 16 latches externally applied address signals $A_0$ to $A_7$ and applies the same to the column predecoder 18 as the column address signals. The column predecoder 18 predecodes the column address signals and applies column selection signals to the column decoder group 19 and to a spare column decoder 20. The column decoder group 19 selects one column in the memory cell array 1 based on the column selection signal. In this manner, one word line and one bit line are selected and reading or writing of information is carried out for the memory cell at the intersection. In FIG. 1, only the selected one word line WL, thee selected one bit line BL and a memory cell MC at the intersection thereof are shown.

The reading or writing of the information is selected by the read/write buffer 17. The read/write buffer 17 activates an input buffer 21 or an output buffer 22 in response to an externally applied read/write signal R/W. When the input buffer 21 is activated, the input data $D_{IN}$ is written in the memory cell MC which is selected as described above. When output buffer 22 is activated, the information stored in the memory cell MC which is selected as described above is read as the output data $D_{OUT}$. Each of the above described circuits is formed on the same semiconductor chip 23.

Meanwhile, sometimes defective memory cells are generated in the process of manufacturing. There are some defective word lines such as snapped ones. If the defects are generated only in some portions, it is economically unpreferable to regard the whole semiconductor memory device formed on the semiconductor chip as a defective. Therefore, it is set beforehand that if a defective memory cell or a defective word line is included in the selected row, a spare row 2 is selected instead of the defective row by the spare row decoder 12. In addition, it is set beforehand that if a defective memory cell or a defective bit line is included in the selected column, a spare column 3 is selected instead of the defective column by the spare column decoder 20. In this manner, the production yield is improved.

FIG. 2 shows a structure of one portion of the row predecoder included in FIG. 1, illustrating the circuit portion for generating the row selection signal $X_i$. $X_i$ denotes one of the signals $X_1$, $X_2$, $X_3$ and $X_4$.

A gate circuit 91 receives the row address signal $RA_2$ and outputs the same signal $\overline{RA_2}$ and the inverted signal $RA_2$ of the row address signal $RA_2$. A gate circuit 92 receives the row address signal $RA_3$ and outputs the same signal $RA_3$ and the inverted signal $\overline{RA_3}$ of the row address signal $RA_3$. Either the signal $RA_2$ or $\overline{RA_2}$ and either the signal $RA_3$ or $\overline{RA_3}$ are inputted to the gate circuits 93, 94, 95 and 96, respectively. The combination of the signals $RA_2$ or $\overline{RA_2}$ and $\overline{RA_3}$ inputted to the gate circuits 93 to 96 is different from each other. Row selection signals $X_1$ to $X_4$ are outputted from the gate circuits 93 to 96, respectively. One of the row selection signals $X_1$ to $X_4$ becomes "H" level and other signals become "L" level in response to the levels of the row address signals $RA_2$ and $RA_3$.

The row selection signal $X_j$ in FIG. 1 means one of the signals $X_5$, $X_6$, $X_7$ and $X_k$ means one of the signals $X_9$, $X_{10}$, $X_{11}$ and $X_{12}$. The row selection signals $X_5$ to $X_8$ are generated in the similar manner as FIG. 2 by the row address signals $RA_4$ and $RA_5$, while the row selection signals $X_9$ to $X_{12}$ are generated in the similar manner as FIG. 2 by the row address signals $RA_6$ and $RA_7$.

FIG. 3 shows the structure of $\phi_x$ subdecoder 10 included in FIG. 1. The $\phi_{x1}$ generation circuit 101, $\phi_{x2}$ generation circuit 102, $\phi_{x3}$ generation circuit 103 and $\phi_{x4}$ generation circuit 104 respectively receive the row address signal $RA_0$ or the inversion signal $\overline{RA_0}$ and the row address signal $RA_1$ or the inversion signal $\overline{RA_1}$ and output subdecode signals $\phi_{x1}$, $\phi_{x2}$, $\phi_{x3}$ and $\phi_{x4}$ in response to the driving signal $\phi_x$. One of the subdecode signals $\phi_{x1}$, $\phi_{x2}$, $\phi_{x3}$ and $\phi_{x4}$ becomes "H" level and others become "L" level in response to the levels of the row address signals $RA_0$, $RA_1$ and of the inversion signals $\overline{RA_0}$, $\overline{RA_1}$.

FIG. 4 shows a detailed structure of the memory cell array 1 and the peripheral portion thereof included in FIG. 1.

4m word lines WL and a plurality of bit line pairs BL and $\overline{BL}$ are arranged intersecting with each other in the memory cell array 1, where m is a positove integer. Four spare word lines SWL are arranged on the side of the word lines WL. A memory cell MC is provided at an intersection of each word line WL and the bit line BL or $\overline{BL}$, while a spare memory cell SMC is provided at an intersection of each spare word line SWL and the bit line BL or $\overline{BL}$. (4m+4( word drivers 13a are provided corresponding to 4m word lines WL and 4 spare word lines SWL. Each of the word lines WL and each of the spare word lines SWL is connected to the corresponding word driver 13a. 4m word lines WL and 4m word drivers 13a are divided into m sets, each comprising four word lines WL and four word drivers 13a. m row decoders 11a are provided corresponding to the m sets. Each row decoder 11a selects four word drivers 13a of the corresponding set. One spare row decoder 12 is provided corresponding to four spare word lines SWL and four word drivers 13a. The spare row decoder 12 selects four corresponding word drivers 13a.

A plurality of sense amplifiers 14a and a plurality of column decoders 19a are provided corresponding to a plurality of bit line pairs BL and $\overline{BL}$. Each bit line pair BL and $\overline{BL}$ is connected to the corresponding sense amplifier 14a and the corresponding column decoder 19a.

The operation of the circuit shown in FIG. 4 will be described in the following.

One of the row decoders 11a is selected based on the row selection signals $X_i$, $X_j$ and $X_k$. The selected row decoder 11a drives four word drivers 13a of the corresponding set. One of the four word drivers 13a drives the corresponding word line WL in response to the subdecode signals $\phi_{x1}$ to $\phi_{x4}$. Consequently, the information in the memory cell MC connected to the word line WL is read onto each bit line BL or $\overline{BL}$ and is amplified by the sense amplifier 14a. One of the column decoders 19a is selected in response to the column address signal. In writing, the information is written onto the bit line pair BL and $\overline{BL}$ connected to the selected column decoder 19a. In reading, the information on the bit line pair BL and $\overline{BL}$ connected to the selected column decoder 19a is read.

When a defective memory cell or a defective word line is formed in the process of manufacturing, a spare row decoder 12 is selected instead of the row decoder 11a which is in correspondence with the defective memory cell or the defective word line. More specifically, when an address signal is applied to select the row decoder 11a corresponding to the defective memory cell or the defective word line, the spare row decoder 12 is selected instead of the row decoder 11a. One of the word drivers 13a connected to the spare row decoder 12 drives the corresponding spare word line SWL in response to the subdecode signals $\phi_{x1}$ to $\phi_{x4}$.

FIG. 5 shows definite circuit structure of the row decoder 11a and the word driver 13a shown in FIG. 4.

The row decoder 11a comprises N channel MOS transistors Q1 to Q4, P channel MOS transistors Q5 to Q7 and a linking device LNO. The linking device LNO is formed of polycrystalline silicon, aluminum or the like and it can be blown out by a laser beam or the like. The transistors Q5 and Q6 are coupled between the supply potential $V_{CC}$ and a node N1. A precharge signal $\overline{\phi_p}$ is applied to the gate of the transistor Q5 and the gate of the transistor Q6 is connected to a node N2. The linking device LNO and the transistors Q1, Q2 and Q3 are coupled in series between the node N1 and the ground potential. Row selection signals $X_1$, $X_j$ and $X_k$ are respectively applied to the gates of the transistors Q1, Q2 and Q3. As described above, $X_i$ denotes one of $X_1$ to $X_4$, $X_j$ denotes one of $X_5$ to $X_8$ and $X_k$ denotes one of $X_9$ to $X_{12}$. The combination of the row selection signals $X_i$, $X_j$ and $X_k$ applied to each row decoder 11a differs from that of other row decoders 11a. The transistor Q7 is coupled between the supply potential $V_{CC}$ and the node N2 and its gate is connected to the node N1. The transistor Q4 is coupled between the node N2 and the ground potential, and its gate is connected to the node N1. The transistors Q4 and Q7 constitute an inverter. Therefore, the level of the node N2 and the level of the node N1 are opposite to each other. When a defect exists in the memory cell or in the word line, the linking device LNO of the corresponding row decoder 11a is blown out beforehand by the laser beam.

The nodes N1 and N2 of each row decoder 11a are connected to the four word drivers 13a of the corresponding set. Each word driver 13a comprises N channel MOS transistors Q8, Q9 and Q10. The transistor Q9 is coupled between one of the subdecode signals $\phi_{xl}$ to $\phi_{x4}$ and a word line WL and its gate is connected to the node N2 of the corresponding row decoder 11a through the transistor Q8. The transistor Q10 is coupled between the word line WL and the ground potential and its gate is connected to the node N1 of the corresponding row decoder 11a. The gate of the transistor Q8 is coupled to the supply potential $V_{CC}$. Word drivers 13a in each set are coupled to respective different ones of the subdecode signals $\phi_{x1}$, $\phi_{x2}$, $\phi_{x3}$ and $\phi_{x4}$.

Next, the operation of the row decoder 11a and the word driver 13a will be described in the following. When the precharge signal $\overline{\phi_p}$ is at the "L" level, the transistor Q5 is in the on state and the potential of the node N1 is at the "H" level ($V_{CC}$ level). Therefore, the transistor Q10 of the word driver 13a is in the on state and the potential of the word line WL is at the "L" level (ground level). When the precharge signal $\overline{\phi_p}$ rises to the "H" level, the transistor Q5 turns off. When row selection signals $X_i$, $X_j$ and $X_k$ applied to the gates of the transistors Q1, Q2 and Q3 all become "H" level, the transistors Q1, Q2 and Q3 all turn on, so that the potential of the node N1 becomes "L" level and the potential of the node N2 becomes "H" level. Consequently, the transistor Q10 of the word driver 13a turns off. When one of the subdecode signals $\phi_{x1}$ to $\phi_{x4}$ rises to the "H" level, the potential of the corresponding word line WL rises to the "H" level. However, if the linking device LNO was blown out, the potential of the node N1 remains "H" level, so that the potential of the word line WL is kept at the "L" level. Therefore, when the linking device LNO was blown out beforehand, the four word lines WL corresponding to the row decoder 11a are not selected.

FIG. 6 shows a concrete circuit structure showing a spare row decoder 12 included in FIG. 4.

The spare row decoder 12 comprises N channel MOS transistors Q11 to Q25, P channel MOS transistors Q26 to Q30 and linking devices LN1 to LN2. The transistors Q29 and Q30 are coupled in parallel between the supply potential $V_{CC}$ and a node N3. The transistors Q11 to Q22 are coupled between teh node N3 and the ground potential through the linking devices LN1 to LN12, respectively. The gates of the transistors Q11 to Q22 are coupled to the row selection signals $X_1$ to $X_{12}$, respectively. The transistors Q26 and Q27 are coupled in parallel between the supply potential $V_{CC}$ and the node N1. The transistors Q23 and Q24 are coupled in series between the node N1 and the ground potential. Precharge signals $\overline{\phi_p}$ are applied to the gate of the transistors Q26, Q23 and Q29. The gates of the transistors Q27 and Q24 are connected to the node N3. The transistor Q28 is coupled between the supply potential $V_{CC}$ and the node N2 and the transistor Q25 is coupled between the node N2 and the ground potential. Gates of the transistors Q28, Q25 and Q30 are connected to the node N1. The transistors Q23, Q24, Q26 and Q27 constitute a two-input NAND gate and the transistors Q25 and Q28 constitute an inverter.

In order to select a spare row decoder 12 instead of a certain row decoder 11a, a linking device out of the linking devices LN1 to LN12 which corresponds to the row decoder 11a is blown out previously. For example, let us assume that the spare decoder 12 should be selected instead of the row decoder 11a shown in FIG. 6. When the linking device LN0 is not blown out, the shown row decoder 11a is selected when the row selection signals $X_1$, $X_5$ and $X_9$ all become "H" level. Therefore, the linking device LN0 of the row decoder 11a and the linking devices LN1, LN5 and LN9 of the spare row decoder 12 are blown out previously.

When the precharge signal $\overline{\phi_p}$ is at the "L" level, the transistor Q26 is in the on state, the transistor Q23 is in the off state and the node N1 is precharged to the "H" level. Therefore, the node N2 is at the "L" level. On this occassion, since the transistor Q29 is in the on state, the node N3 is precharged to the "H" level, so that the transistor Q27 is in the off state and the transistor Q24 is in the on state. When the precharge signal $\overline{\phi_p}$ rises to the "H" level, the transistor Q26 turns off and the transistor Q23 turns on. Therefore, the potential of the node N1 becomes "L" level and the potential of the node N2 becomes "H" level. At this time, the transistor Q29 turns off and the transistor Q30 turns on. When the row selection signals $X_1$, $X_5$ and $X_9$ all become "H" level, the transistors Q11, Q15 and Q19 turn on. However, since the linking devices LN1, LN5 and LN9 connected to these transistors Q11, Q15 and Q19 have been cut, the potential of the node N3 is maintained at the "H" level. Therefore, the potential of the node N1 remains at the "L" level and the potential of the node N2 remains at the "H" level. This state means that the spare row decoder 12 is selected.

When at least one of the row selection signals other than the signals $X_1$, $X_5$ and $X_9$ becomes "H" level, then at least one transistor other than the transistors Q11, Q15 and Q19 turns on, so that the potential of the node N3 becomes "L" level. Consequently, the transistor Q27 turns on and the transistor Q24 turns off, and, as a result, the node N1 becomes "H" level and the node N2 becomes "L" level. This state means that the spare row decoder 12 is not selected. In this manner, when the linking devices LN1, LN5 and LN9 are cut, the spare row decoder 12 is selected instead of the row decoder 11a when the row selection signals $X_1$, $X_5$ and $X_9$ become "H" level.

The operation of the semiconductor memory device shown in FIGS. 1 to 6 will be described with reference to the timing chart of FIG. 7.

In the standby period when the precharge signal $\overline{\phi_p}$ is at the "L" level, the potential of the nodes N1 is at the "H" level and the potential of the nodes N2 is at the "L" level for all row decoders 11a and the spare row decoder 12. Therefore, the potential of all word lines WL and all spare word lines SWL is at the "L" level.

The row decoder 11a corresponding to normal memory cells MC and normal four word lines WL (hereinafter referred to as a normal decoder) is selected. After the precharge signal $\overline{\phi_p}$ rises to the "H" level, the signals $X_i$, $X_j$ and $X_k$ applied to the selected row decoder 11a all become "H" level. Therefore, the potential of the node N1 falls to the "L" level and the potential of the node N2 rises to the "H" level. Consequently, the corresponding four word drivers 13a are selected. When one of the subdecode signals $\phi_{x1}$ to $\phi_{x4}$ rises to the "H" level, the potential of the corresponding word line WL is raised to the "H" level by the word driver 13a. At this time, the potential of the spare word line SWL remains at the "L" level.

Description will be given of a case in which a row decoder 11a (hereinafter referred to as a defective decoder) corresponding to a defective memory cell MC or a defective word line WL is selected. After the precharge signal $\overline{\phi_p}$ rises to the "H" level, the row selection signals $X_i$, $X_j$ and $X_k$ which are to be applied to the selected defective decoder 11a all become "H" level. However, the linking device LN0 of the defective decoder 11a has been blown out previously, so that the potential of the node N1 remains at the "H" level and the potential of the node N2 remains at the "L" level. Therefore, the four word drivers 13a corresponding to the defective decoder 11a are not selected so that the potential of the corresponding word line WL remains at the "L" level even if one of the subdecode signals $\phi_{x1}$ to $\phi_{x4}$ rises to the "H" level. At this time, the spare row decoder 12 is selected instead of the defective decoder 11a and, as a result, one of the spare word lines SWL rises to the "H" level. In the above described case, in the row decoders 11a which are not selected by the address signals (non-selected decoders), at least one of the applied row selection signals $X_i$, $X_j$ and $X_k$ maintains "L" level, so that the potential of the node N1 remains at the "H" level and the potential of the node N2 remains at the "L" level. Therefore, the potential of the corresponding word lines WL is maintained at the "L" level.

As described above, even if a defective memory cell or a defective word line is generated in the process of manufacturing, the defective decoder can be replaced by a spare decoder, so that it can be used as a normal semiconductor memory device.

In the above described semiconductor memory device, when a defect such as a defect in the memory cell (bit defect), snapping of word line, short circuit of the word line in the same row decoder is generated, the defect can be compensated for by replacing the corresponding row decoder with a spare row decoder. For example, as shown in FIG. 8, the snapping (shown by d1) of the word line WL corresponding to the row decoder 11a-j or a short circuit (shown by d2) between word lines WL corresponding to the row decoder 11a-j can be compensated for. However, if a defect such as a short circuit between word lines corresponding to different row decoders, the defects remain even when the replacement of one spare row decoder is effected. For example, a short circuit (shown by d3) between the word line belonging to the row decoder 11a-j and the word line belonging to the row decoder 11a-k can be compensated for only by providing two spare row decoders. Such problem seems to become more serious as the memory devices have been implemented with larger capacities and the devices have been made more minute.

One object of the invention is to provide semiconductor devices wherein various defects therein detected during manufacture can be corrected.

Another object of the invention is to provide improved circuit redundancy within programmable arrays of semiconductor components, wherein large defects can be corrected.

Another object is to provide, within a programmable array of semiconductor components that can be addressed by line decoders each for selecting among a predetermined number of signal lines, improved circuit redundancy wherein short ciruits between signal lines of different line decoders can be corrected.

A further object of the invention is to provide circuit redundancy within semiconductor memory arrays, wherein the group of word lines belonging to a row decoder to be replaced by a spare decoder can be varied.

A further object of the invention is to provide, within a semiconductor memory device of a type having an array of memory cells arranged at intersections of bit lines and word lines, wherein row decoders select among predetermined numbers of different word lines and column decoders select among predetermined numbers of different bit line, improved circuit redundancy wherein short circuits between word lines of different row decoders can be corrected.

A still further object is to substantially enhance production yield of semiconductor device arrays by correcting various defects produced in the process of manufacturing the arrays.

An additional object of the invention is to provide improved circuit redundancy within semiconductor dynamic random access memories.

The semiconductor memory device in accordance with the present invention is a semiconductor memory device having a redundant circuit, comprising: a plurality of selection lines; a plurality of spare selection lines; a plurality of memory cells each of which connected to any one of the plurality of selection lines; and a plurality of spare memory cells each of which is connected to any one of the plurality of spare selection lines. The plurality of selection lines are divided into a plurality of first sets each comprising prescribed plurality of selection lines and are divided into a plurality of second sets each comprising a prescribed plurality of selection lines. The semiconductor memory device comprises a plurality of selection means, spare selection means and switching means. Each of the selection means is selectively coupled to the plurality of selection lines of each of the first sets or to the plurality of selection lines of each of the second sets and is activated in response to a prescribed selection signal for selecting the selection lines in each of the first sets or the selection lines of each of the second sets. The spare selection means is coupled to the plurality of spare selection lines and is activated instead of any one of the selection means to select the plurality of spare selection lines. The switching means is to selectively couple each selection means to the plurality of selection lines in each of the first sets or to the plurailty of selection lines in each of the second sets.

According to the semiconductor device of the present inventon, since each selection means can be selectively connected to the plurality of selection lines in each of the first sets or to the plurality of selection lines in each of the second sets by the switching means, when a defect is generated over a plurality of selection lines, the state of coupling of the plurality of selection lines and the selection means can be switched so that the defective selection lines are coupled to one selection means. Therefore, by replacing the selection means coupled to the defective selection lines with one spare selection means, the defects over a plurality of selection lines can be repaired.

In accordance with another aspect of the present invention, a system for repairing defects in a semiconductor device formed of an array of semiconductor components arranged at intersections of rows and columns, and including pluralities of address decoder means for selecting the components in response to external row and column address signals, each decoder means connected to a different group of address lines, and redundancy circuit means comprising a spare decoder means, a plurality of spare address lines connected to the spare decoder means, and a plurality of spare semiconductor components connected to the plurality of spare address lines, comprising: means for measuring the semiconductor device to detect defects therein; means for identifying particular decoder means associated with the defects; means for determining whether the defects detected during the measuring step extend between address lines connected to different particular decoder means, and, in response; means for changing the group of address lines connected to the one of the particular decoder means; and means for replacing the one of the particular decoder means by the spare decoder means.

In accordance with further aspect of the present invention, in a semiconductor device formed of an array of semiconductor components arranged at intersections of rows and columns, and including pluralities of address decoder means for selecting the components in response to external row and column address signals, each decoder means connected to a different group of address lines, and redundancy circuit means comprising a spare decoder means, a plurality of spare address lines connected to the spare decoder means, and a plurality of spare semiconductor components connected to the plurality of spare addres lines; a method of correcting defects in the semiconductor device, comprising the steps of: measuring the semiconductor device to detect defects therein; identifying particular decoder means associated with the defects; determining whether the defects detected during the measuring step extend between address lines connected to different particular decoder means, and, in response; changing the group of address lines connected to the one of the particular decoder means; and replacing the one of the particular decoder means by the spare decoder means.

These objects and other objects, features, aspects and advantages of the present invention will become more apparent from the following detailed description of the present invention when taken in conjunction with the accompany drawings.

DESCRIPTION OF THE PREFERRED EMBODIMENTS

The embodiments of the present invention will be hereinafter described with reference to the figures.

Figure 9:
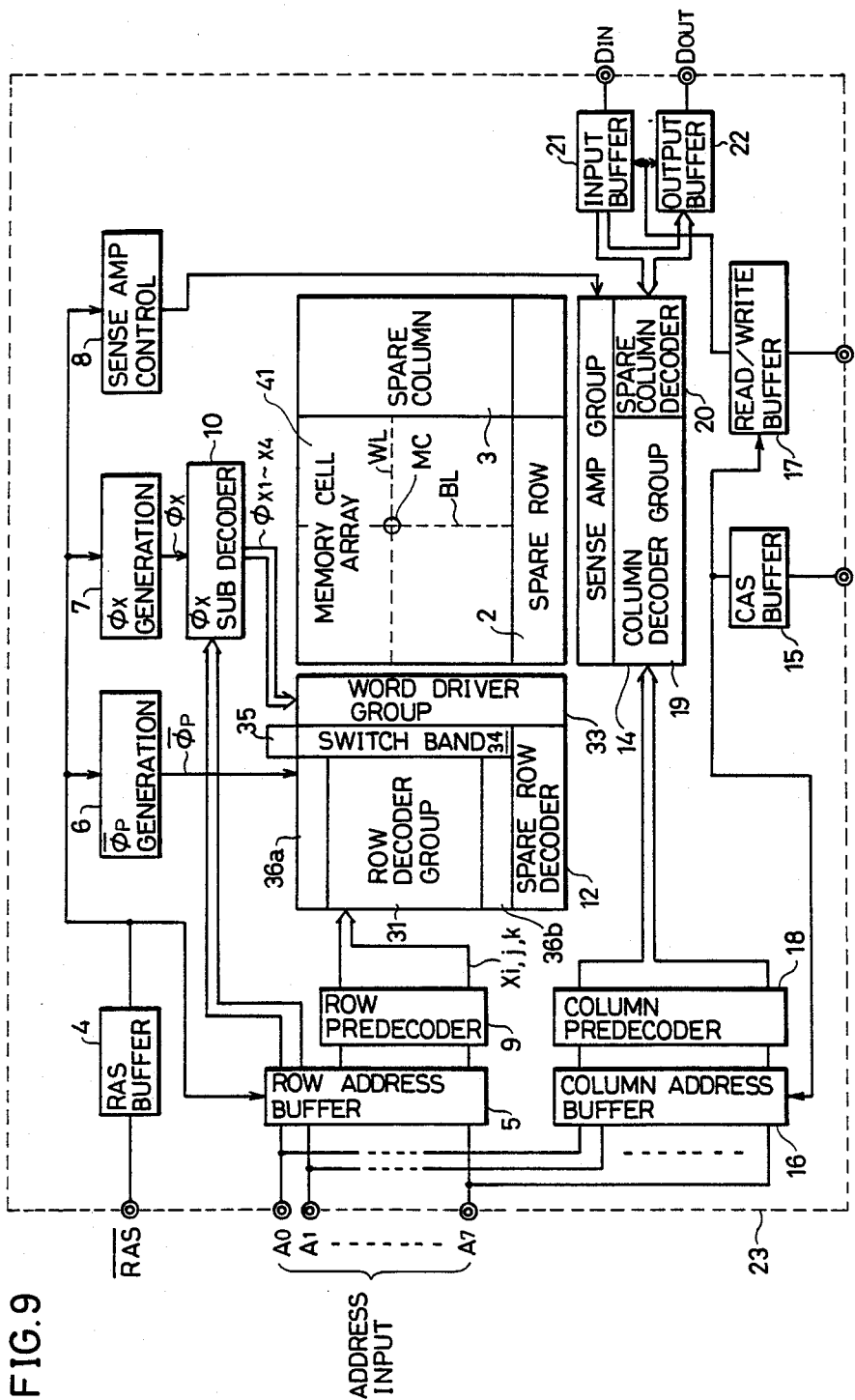
FIG. 9 is a block diagram showing a structure of a semiconductor memory device in accordance with one embodiment of the present invention.

FIG. 9 is a block diagram showing the structure of a semiconductor memory device (Dynamic Random Access Memory) in accordance with one embodiment of the present invention.

Figure 1:
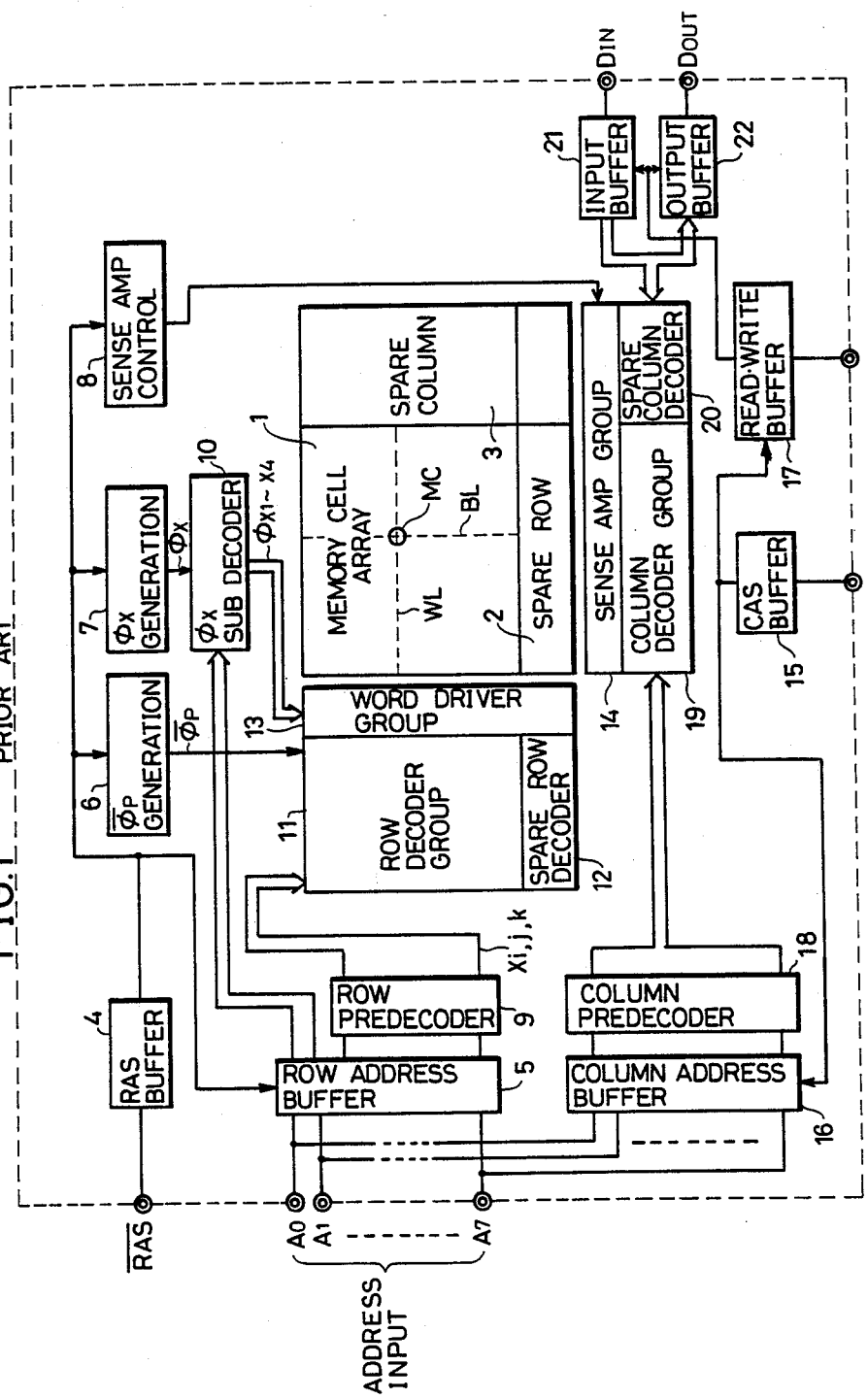
FIG. 1 is a block diagram showing a structure of a conventional semiconductor memory device.

The semiconductor memory device of FIG. 9 differs from the conventional semiconductor memory device of FIG. 1 in that the structure of the memory cell array 41 and the word driver group 33 is different, and that a switch band 34, a setting circuit 35 and clamp circuits 36a and 36b are newly provided. Since the structure and operation of other portions of the embodiment are the same as that of the semiconductor memory device shown in FIG. 1, so that the corresponding portions are denoted by the same reference numerals and the description thereof will be omitted.

The switch band 34 is a circuit for changing the state of coupling between the row decoders included in the row decoder group 31 and the word drivers included in the word driver group 33. The setting circuit 35 is to set the state of the switch band 34. The clamp circuits 36a and 36b are to inactivate the word drivers separated from the row decoder group 31 by the function of the switch band 34.

Figure 10:
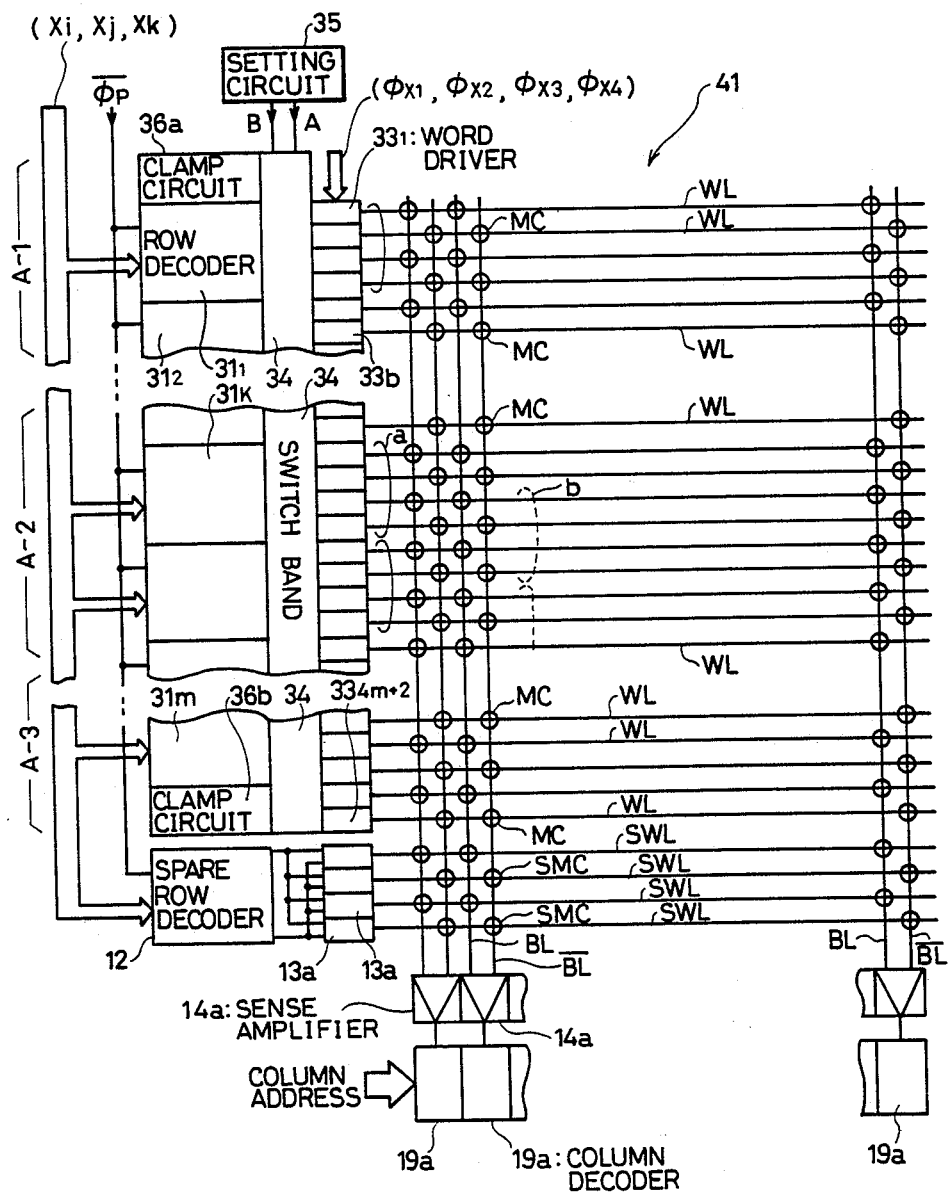
FIG. 10 shows detailed structure of the memory cell array and a peripheral portion thereof shown in FIG. 9.

FIG. 10 is a block diagram showing a detailed structure of the memory cell array 41 and the peripheral portion thereof included in FIG. 9.

(4m+2) word lines WL and a plurality of bit line pairs BL; $\overline{BL}$ are arranged intersecting with each other in the memory cell array 41, where m is a positive integer. Four spare word lines SWL are arranged in the side of the word lines WL. A memory cell MC is provided at an intersection of each word line WL and the bit line BL or $\overline{BL}$ and a spare memory cell SMC is provided at an intersection of each spare word line SWL and the bit line BL or $\overline{BL}$. (4m+2) word drivers $33_1$ to $33_{4m+2}$ are provided corresponding to (4m+2) word lines WL, while four word drivers 13a are provided corresponding to four spare word lines SWL. Each of the word lines $WL_1$ to $WL_{4m+2}$ and each of the spare word lines SWL are connected to the corresponding word drivers $33_1$ to $33_{4m+2}$, $33_a$. m row decoders $31_1$ to $31_m$ and one spare row decoder 12 are provided. Clamp circuits 36a and 36b are arranged further outside of the row decoder $31_1$ and the row decoder $31_m$ at both end portions, respectively. The switch band 34 is provided between the m row decoders $31_1$ to $31_m$ and the word drivers $33_1$ to $33_{4m+2}$. Setting signals A and B are provided from the setting circuit 35 to the switch band 34. Each of the row decoders $31_1$ to $31_m$ is coupled to four word drivers, respectively, through the switch band 34. Two remaining word drivers which are not coupled to any of the row decoders $31_1$ to $31_m$ are made inactive by the clamp circuit 36a or 36b. The state of coupling between the row decoders $31_1$ to $31_m$ and the word drivers $33_1$ to $33_{4m+2}$ is set in response top the levels of the setting signals A and B applied from the setting circuit 35 to the switch band 34.

Figure 2:
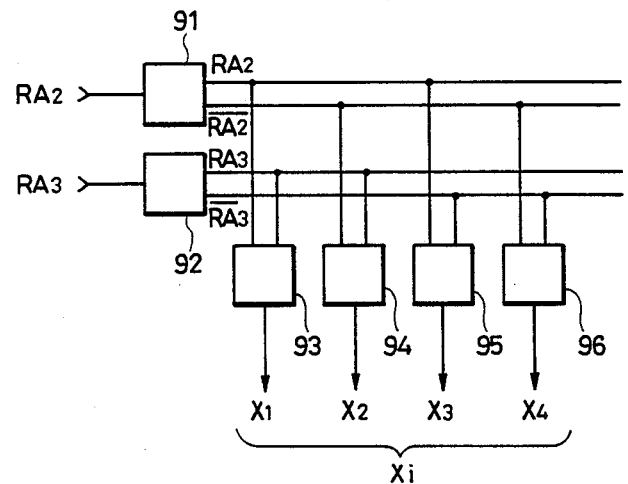
FIG. 2 shows a detailed structure of a main portion of a row predecoder shown in FIGS. 1 and 9.
Figure 3:
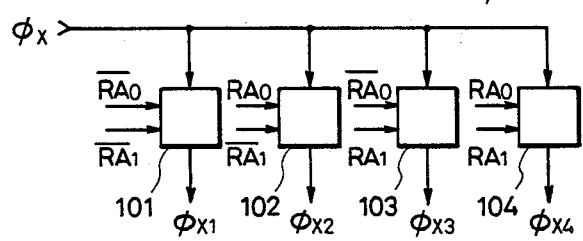
FIG. 3 shows a detailed structure of a $\phi_x$ subdecoder shown in FIGS. 1 and 9.
Figure 4:
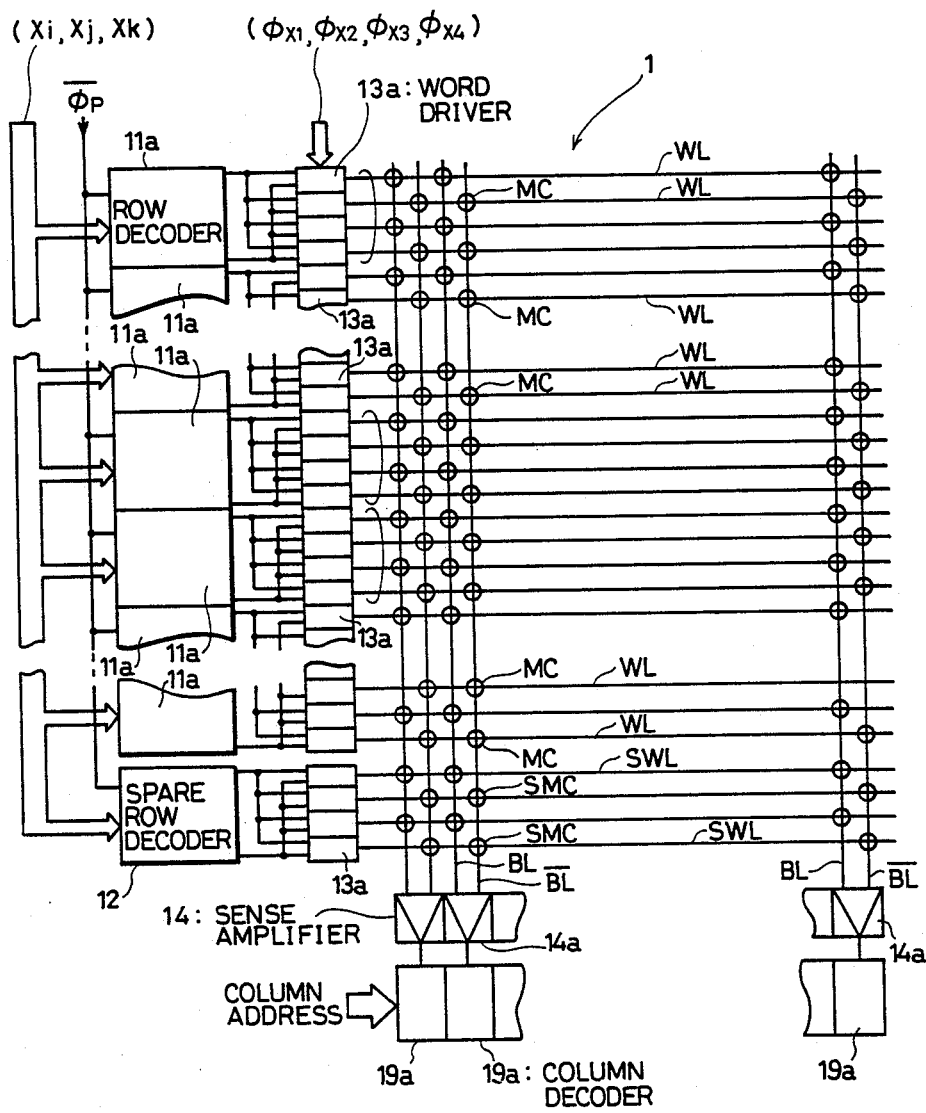
FIG. 4 shows a detailed structure of the memory cell array and the peripheral portion thereof shown in FIG. 1.
Figure 6:
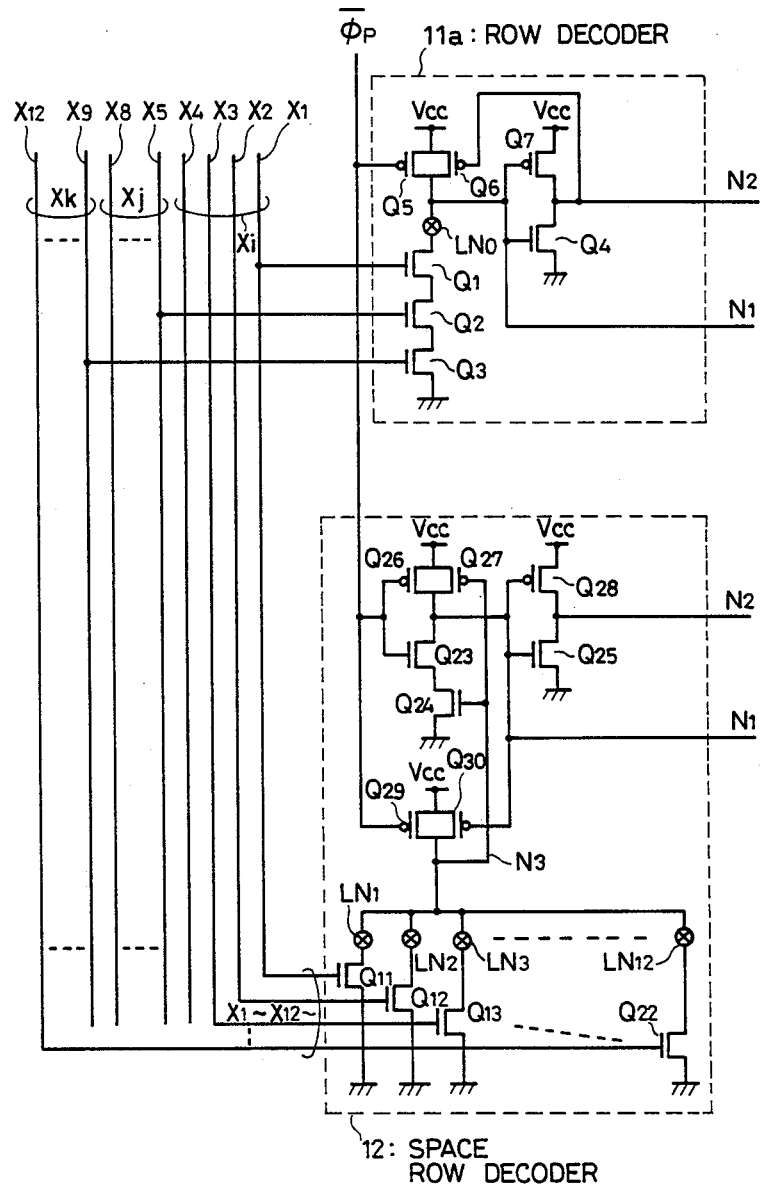
FIG. 6 is a definite circuit structure of a spare row decoder shown in FIGS. 4 and 10.

The structure of the row predecoder 9 shown in FIG. 9 is the same as that shown in FIG. 2 and the structure of the $\phi_x$ subdecoder 10 is the same as that shown in FIG. 3. The structure of the spare row decoder 12 shown in FIGS. 9 and 10 is the same as that shown in FIG. 6 and the connection between the spare row decoder 12 and the word driver 13a is the same as that shown in FIG. 14.

Figure 11A:
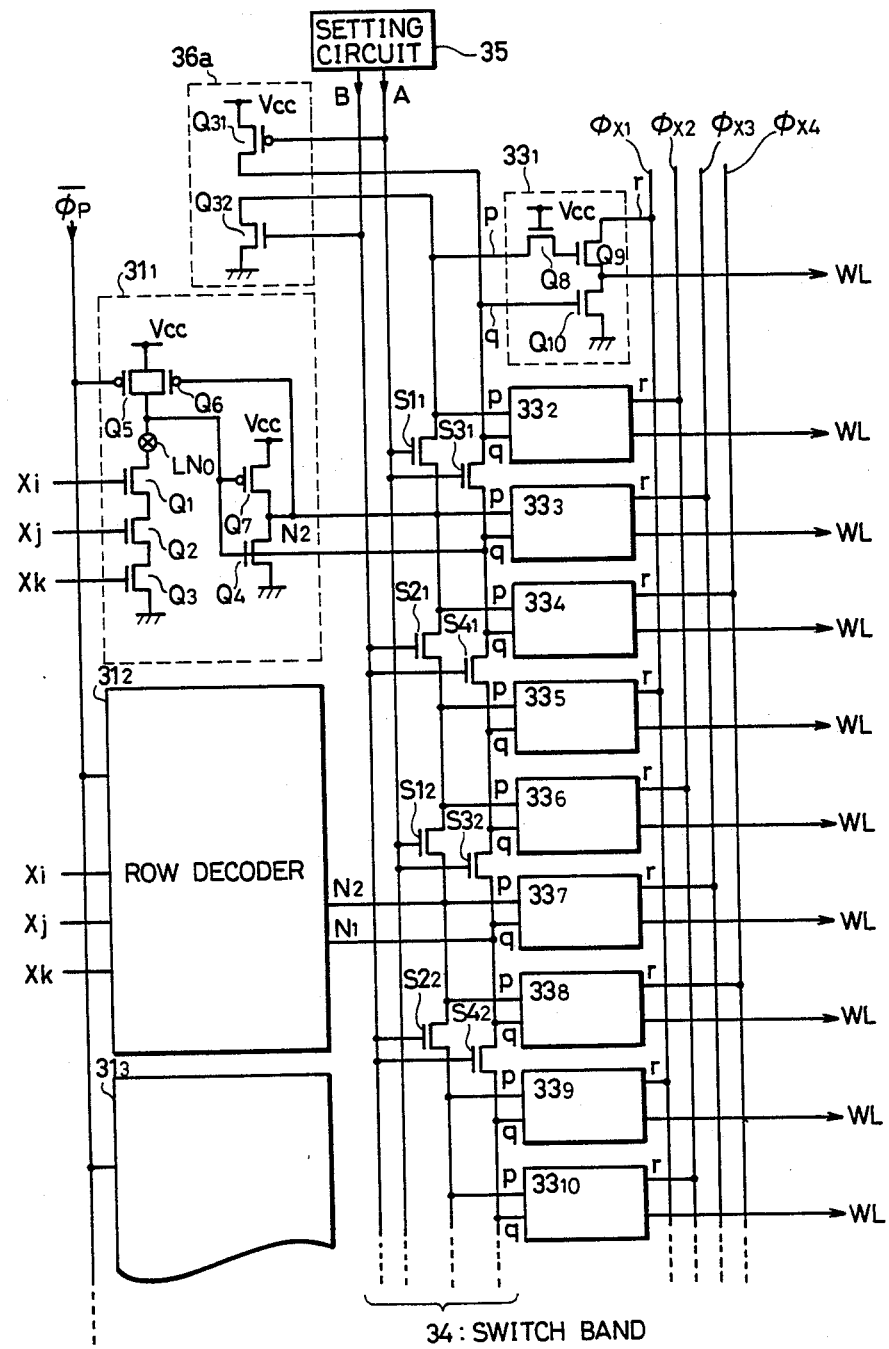
FIG. 11A is a schematic diagram showing the structure of the portion A-1 of FIG. 10 in more detail.
Figure 11B:
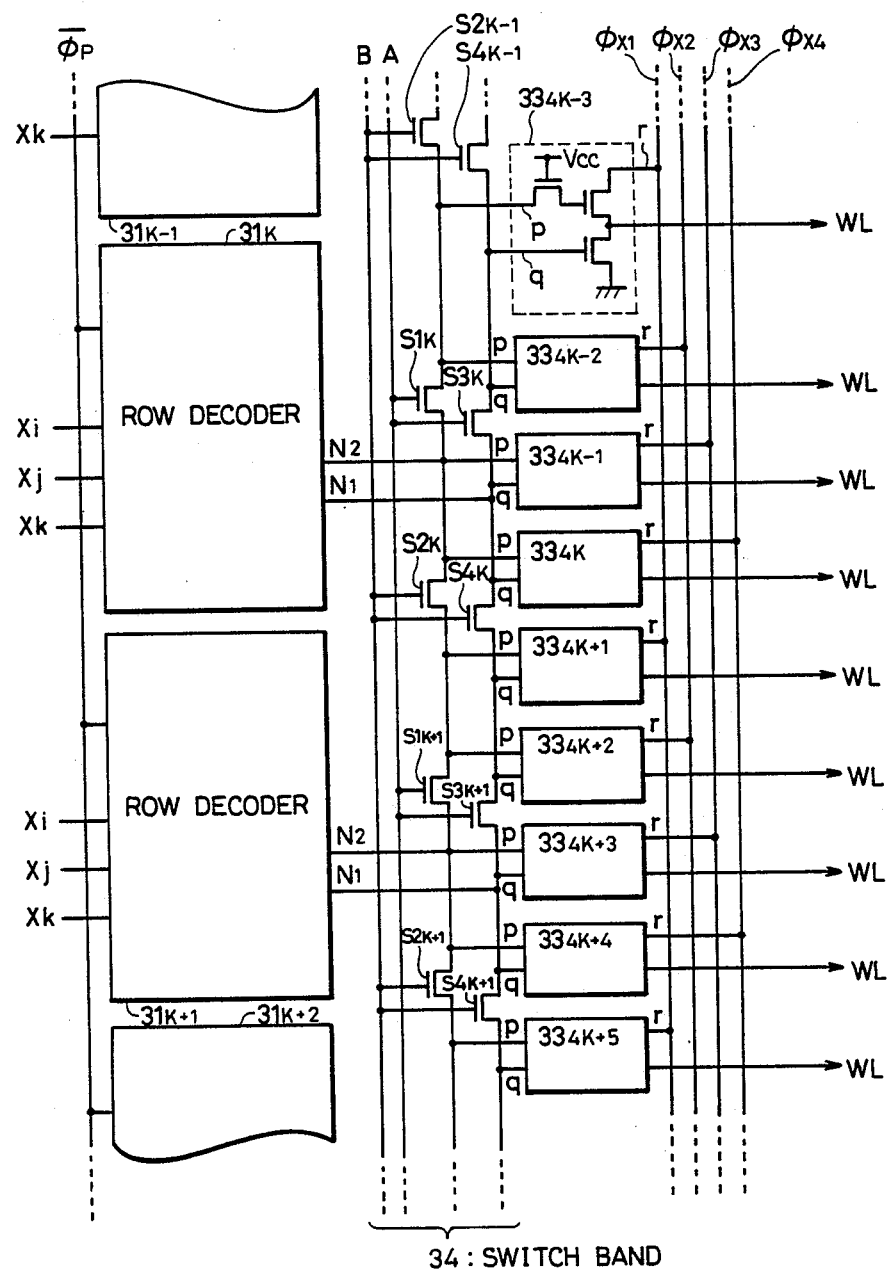
FIG. 11B is a schematic diagram showing the structure of the portion A-2 of FIG. 10 in more detail.
Figure 11C:
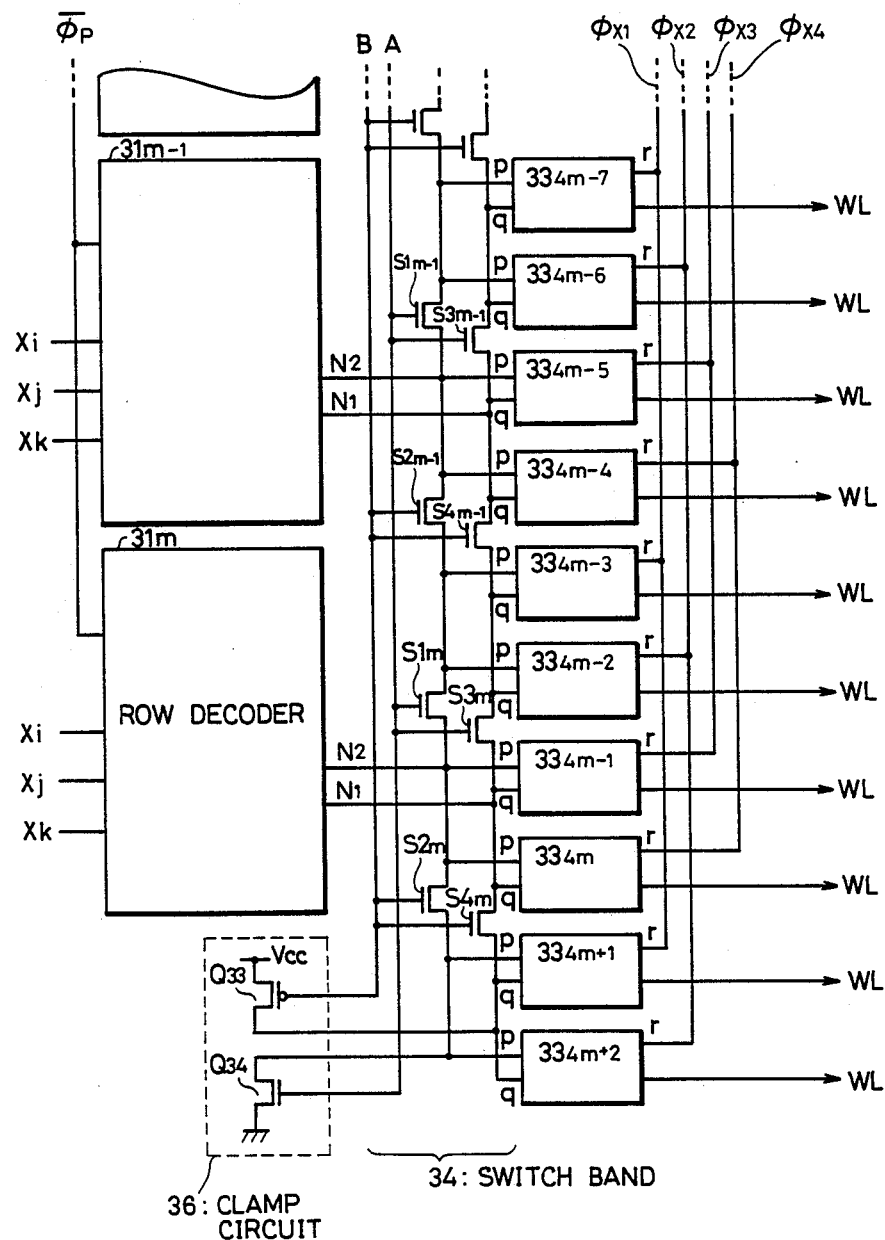
FIG. 11C is a schematic diagram showing the structure of the portion A-3 of FIG. 10 in more detail.

FIGS. 11A, 11B and 11C respectively show the portions A-1, A-2 and A-3 of FIG. 10 in more detail. Referring to FIGS. 11A to 11C, the word drivers $33_1$ to $33_{4m+2}$ comprise transistors Q8, Q9 and Q10 as the word driver 13a shown in FIG. 5. The transistor Q9 is connected between the node r and a word line WL and its gate is connected to a node p through the transistor Q8. The transistor Q10 is coupled between the word line WL and the ground potential, and its gate is connected to a node q. The gate of the transistor Q8 is coupled to the supply potential $V_{CC}$. The nodes r of the word drivers $33_{4k+1}$ to $33_{4k+4}$ are respectively coupled to the subdecode signals $\phi_{x1}$ to $\phi_{x4}$. Here, k is an integer from 0 to m−1. The nodes r of the word drivers $33_{4m+1}$ and $33_{4m+2}$ are resepectively coupled to the subdecode signals $\phi_{x1}$ and $\phi_{x2}$.

The switch band 34 comprises m first N channel MOS transistors $S1_1$ to $S1_m$, m second N channel MOS transistors $S2_1$ to $S2_m$, m third N channel MOS transistors $S3_1$ to $S3_m$ and m fourth N channel MOS transistors $S4_1$ to $S4_m$. The clamp circuit 36a comprises a P channel MOS transistor Q31 and an N channel MOS transistor Q32. The clamp circuit 36b comprises a P channel MOS transistor Q33 and an N channel MOS transistor Q34. A setting signal A is applied to the gates of the transistors Q31 and Q34 from the setting circuit 35. A setting signal B is applied to the gates of the transistors Q32 and Q33 from the setting circuit 35.

One conduction terminal of the transistor Q32 of the clamp circuit 36a and one conduction terminal of the transistor Q34 of the clamp circuit 36b are coupled to the group potential. The first transistors $S1_1$ to $S1_m$ and the second transistors $S2_1$ to $S2_m$ of the switch band 34 are alternately connected in series between the other conduction terminal of the transistor Q32 and the other conduction terminal of the transistor Q34. The setting signal A is applied to the gates of the first transistors $S1_1$ to $S1_m$ from the setting circuit 35 and the setting signal B is applied to the gates of the second transistors $S2_1$ to $S2_m$ from the setting circuit 35. One conduction terminal of the transistor Q31 of the clamp circuit 36a and one conduction terminal of the transistor Q33 of the clamp circuit 36b are coupled to the supply potential $V_{CC}$. The third transistors $S3_1$ to $S3_m$ and the fourth transistors $S4_1$ to $S4_m$ are alternately connected in series between the other conduction terminal of the transistor Q31 and the other conduction terminal of the transistor Q33. The setting signal A is applied to the gates of the third transistors $S3_1$ to $S3_m$ and the setting signal B is applied to the gates of the fourth transistors $S4_1$ to $S4_m$ from the setting circuit 35.

Figure 5:
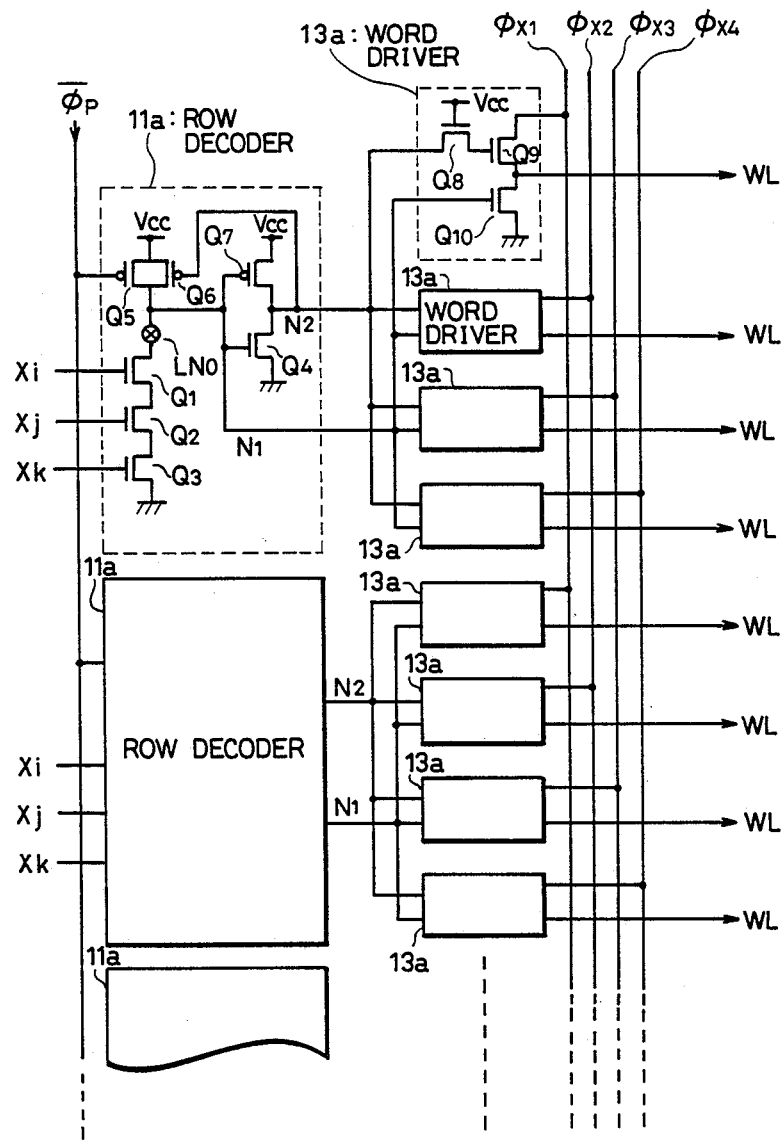
FIG. 5 shows the structure of the main portion of FIG. 4 in more detail.

The structure of the row decoders $31_1$ to $31_m$ is completely the same as the structure of the row decoder 11a shown in FIG. 5. The node N2 of each row decoder $31_k$ is connected to the node of the first transistor $S1_k$ and the second transistor $S2_k$ while the node N1 is connected to the node of the third transistor $S3_k$ and the fourth transistor $S4_k$. k is an integer from 1 to m.

The node p of the word drivers $33_1$ and $33_2$ is connected to the node of the transistor Q32 of the clamp circuit 36a and the first transistor $S1_1$. The node q of the word drivers $33_1$ and $33_2$ is connected to the node of the transistor Q31 of the clamp circuit 36a and the third transistor $S3_1$. The node p of the word drivers $33_{4k-1}$ and $33_{4k}$ is connected to the node between the first transistor $S1_k$ and the second transistor $S2_k$. The node q of the word drivers $33_{4k-1}$ and $33_{4k}$ is connected to the node between the third transistor $S3_k$ and the fourth transistor $S4_k$. k is an intetger from 1 to m. The node p of the word drivers $33_{4k+1}$ and $33_{4k+2}$ is connected to the node between the second transistor $S2_k$ and the first transistor $S1_{k+1}$. The node q of the word drivers $33_{4k+1}$ and $33_{4k+2}$ is connected to the node between the fourth transistor $S4_k$ and the third transistor $S3_{k+1}$. k is an integer from 1 to m−1. In addition, the node p of the word drivers $33_{4m+1}$ and $33_{4m+2}$ is connected to the node between the second transistor $S2_m$ and the transistor Q34 of the clamp circuit 36b. The node q of the word drivers $33_{4m+1}$ and $33_{4m+2}$ is connected to the node between the fourth transistor $S4_m$ and the transistor Q33 of the clamp circuit 36b.

Figure 12A:
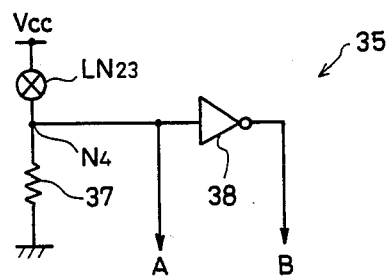
FIG. 12A is a definite circuit diagram of a setting circuit shown in FIGS. 9 and 10.

As shown in FIG. 12, the setting ciruit 35 comprises a linking device LN23, a resistance 37 and an inverter 38. The linking device LN23 and the resistance 37 are coupled in series between the supply potential $V_{CC}$ and the ground potential. An input terminal of the inverter 38 is connected to the node N4 between the linking device LN23 and the resistance 37. The setting signal A is outputted from the node N4 and the setting signal B is outputted from the inverter 38.

Referring to FIGS. 11A to 11C, when the setting signal A from the setting circuit 35 is at the "H" level and the setting signal B is at the "L" level, the first transistors $S1_1$ to $S1_m$ and the third transistors $S3_1$ to $S3_m$ turn on while the second transistors $S2_1$ to $S2_m$ and the fourth transistors $S4_1$ to $S4_m$ turn off. Consequently, the nodes N2 and N1 of the row decode $31_k$ are connected to the nodes p and q of the word drivers $33_{4k-3}$, $33_{4k-2}$, $33_{4k-1}$ and $33_{4k}$, respectively. Here, k is an integer from 1 to m. On this occasion, the transistors Q31 and Q32 of the clamp circuit 36a turn off. On the contrary, the transistors Q33 and Q34 of the clamp circuit 36b turn on, so that the potential of the node p of the word drivers $33_{4m+1}$ and $33_{4m+2}$ becomes "L" level and the potential of the node q becomes "H" level. Therefore, the word drivers $33_{4m+1}$ and $33_{4m+2}$ are inactivated.

On the contrary, when the setting signal A from the setting circuit 35 is at the "L" level and the setting signal B is at the "H" level, the second transistors $S2_{1 1}$ to $S2_m$ and the fourth transistors $S4_1$ to $S4_m$ turn on while the first transistors $S1_1$ to $S1_m$ and the third transistors $S3_1$ to $S3_m$ turn off. Consequently, the nodes N2 and N1 of the row decoder $31_k$ are connected to the nodes p and q of the word drivers $33_{4k-1}$, $33_{4k}$, $33_{4k-1}$ and $33_{4k+2}$, respectively. On this occassion, the transistors Q31 and Q32 of the clamp circuit 36a turn on, so that the potential of the node p of the word drivers $33_1$ and $33_2$ becomes "L" level and the potential of the node q becomes "H" level. Consequently, the word drivers $33_1$ and $33_2$ are inactivated. On the contrary, the transistors Q33 and Q34 of the clamp circuit 36b turn off.

As described above, when the setting signal A is at the "H" level and the setting signal B is at the "L" level, each row decoder $31_k$ is coupled to the set of four word drivers $33_{4k-3}$ to $33_{4k}$. Namely, four word drivers $33_{4k-3}$ to $33_{4k}$ are selected by the row decoder $31_k$. On the contrary, when the setting signal A is at the "L" level and the setting signal B is at the "H" level, each row decoder $31_k$ is coupled to the set of four word drivers $33_{4k-1}$ to $33_{4k+2}$. Namely, four word drivers $33_{4k-1}$ to $33_{4k+2}$ are selected by the row decoder $31_k$.

Figure 13:
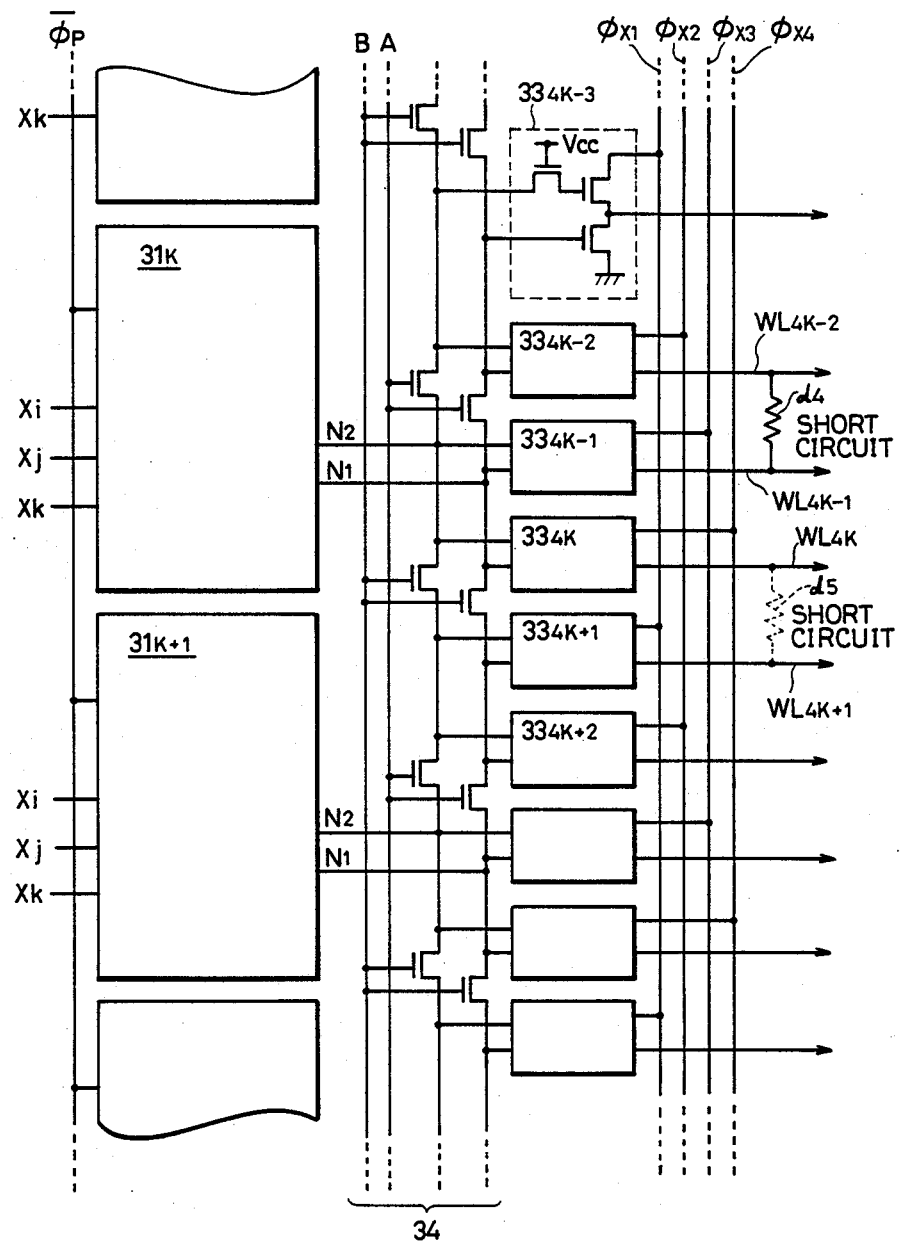
FIG. 13 illustrates the method for repairing a short circuit generated between word lines.

For example, when a short circuit d4 is generated between the word line $WL_{4k-2}$ and the word line $WL_{4k-1}$ as shown by the solid line in FIG. 13, the linking device LN23 of the setting circuit 35 is not blown out so that the setting signal A is set at the "H" level and the setting signal B is set at the "L" level. Consequently, the row decoder $31_k$ is coupled to the word drivers $33_{4k-3}$ to $33_{4k}$. Therefore, by replacing the row decoder $31_k$ with the spare row decoder 12, the word lines $WL_{4k-3}$ to $WL_{4K}$ are replaced with spare word lines SWL, so that the short circuit between the word lines $WL_{4k-2}$ can be compensated for..

When a short circuit d5 is generated between the word line $WL_{4k}$ and the word line $WL_{4k+1}$ as shown by the dotted line in FIG. 13, the linking device LN23 of the setting circuit 35 is blown out previously so that the setting signal A is set at the "L" level and the setting signal B is set at the "H" level. Consequently, the row decoder $31_k$ is coupled to the word drivers $33_{4k-1}$ to $33_{4k+2}$. Therefore, by replacing the row decoder $31_k$ with the spare row decoder 12, the word lines $WL_{4k-1}$ to $WL_{4k+2}$ are replaced with the spare word lines SWL, so that the short circuit between the word lines $WL_{4k}$ and $WL_{4k+1}$ can be compensated for.

Figure 7:
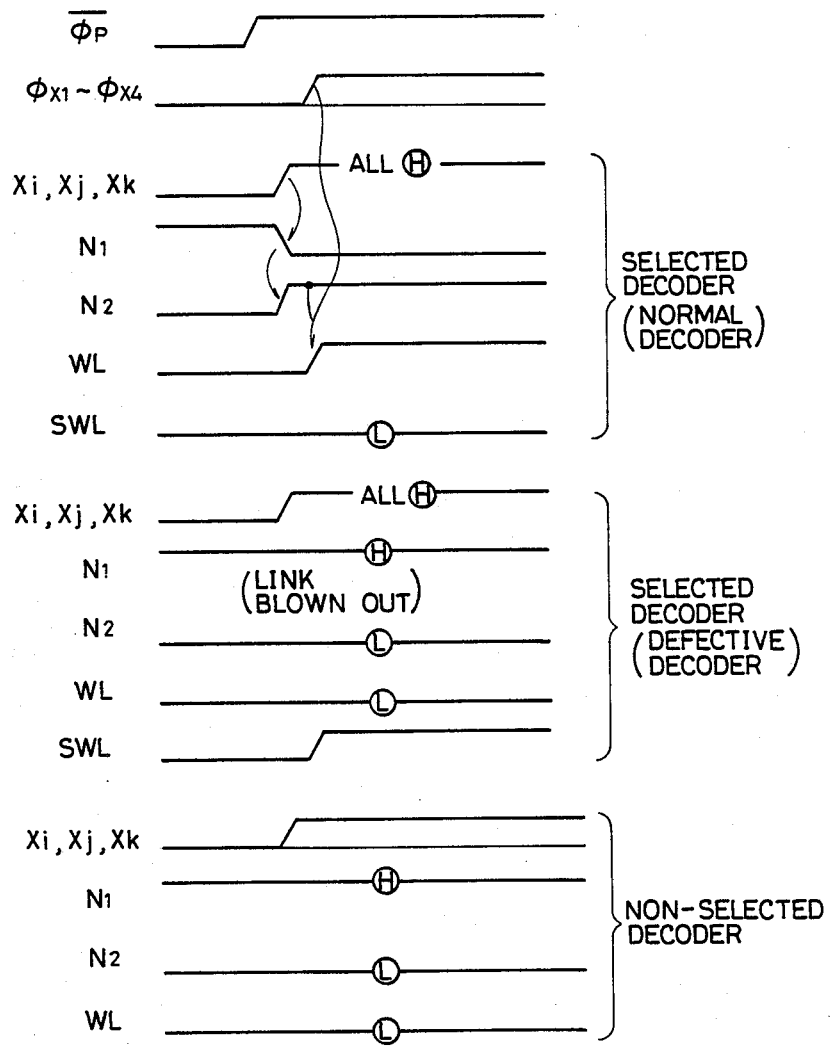
FIG. 7 is a timing chart for illustrating the operation of the row decoder and the spare row decoder of the semiconductor memory device in accordance with one embodiment of the present invention and that of a conventional semiconductor memory device.
Figure 8:
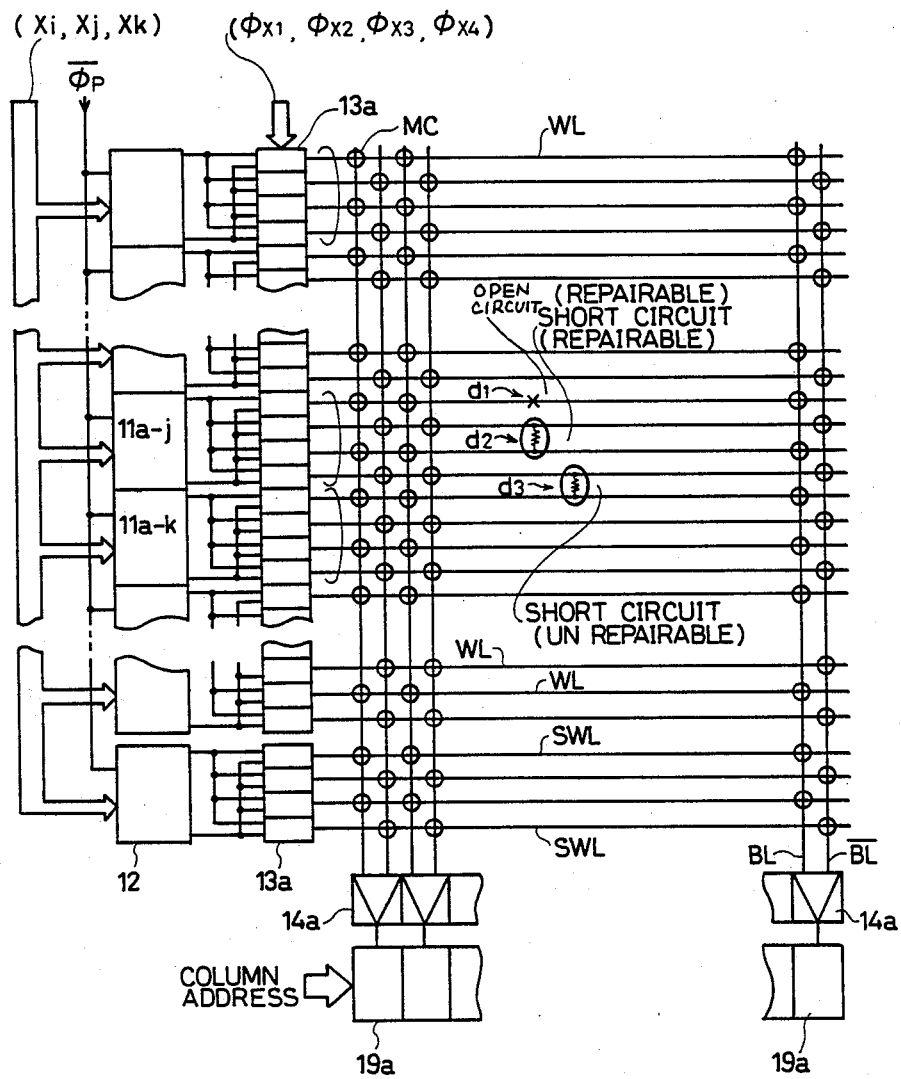
FIG. 8 illustrates defects which can be repaired by a conventional semiconductor memory device.

Meanwhile, the operation of each row decoder in the semiconductor memory device is the same as the operation described with reference to FIG. 7.

Figure 12B:
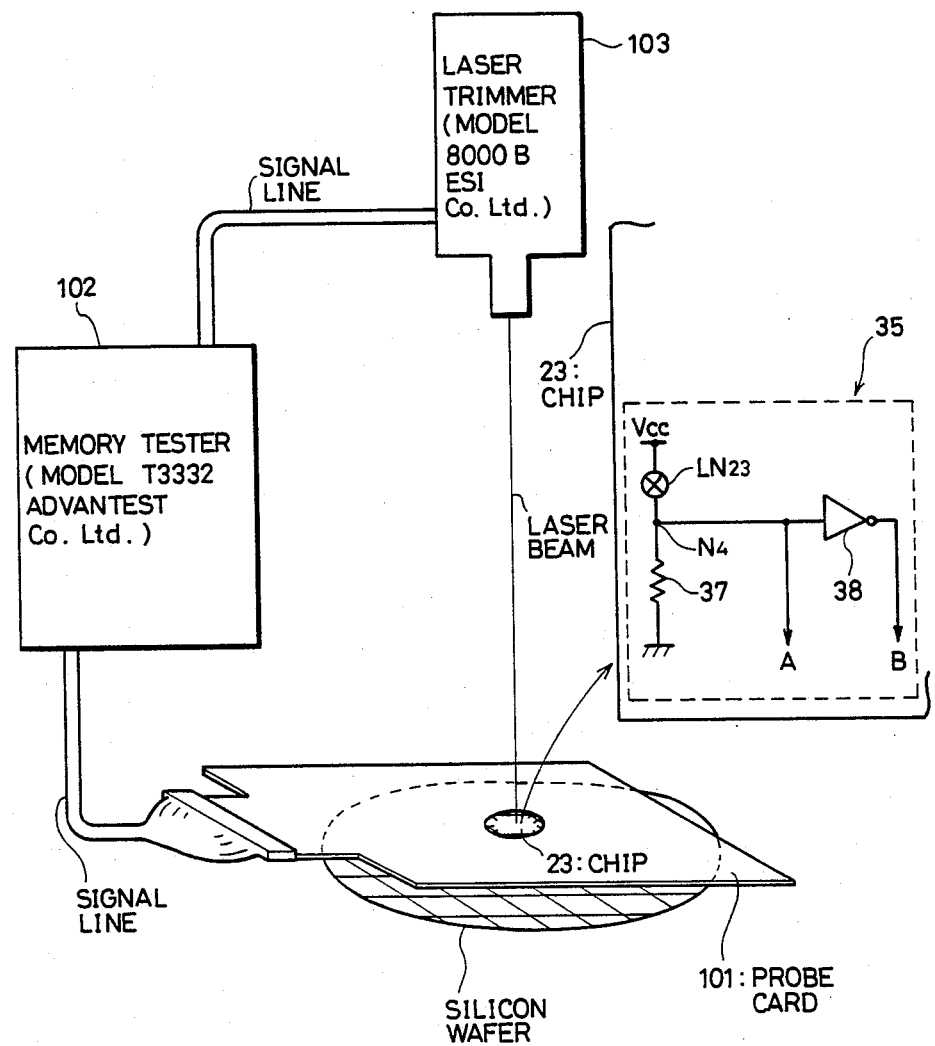
FIG. 12B shows a system for automated defect detection and repair of the semiconductor memory device of FIGS. 9 to 11C.
Figure 12C:
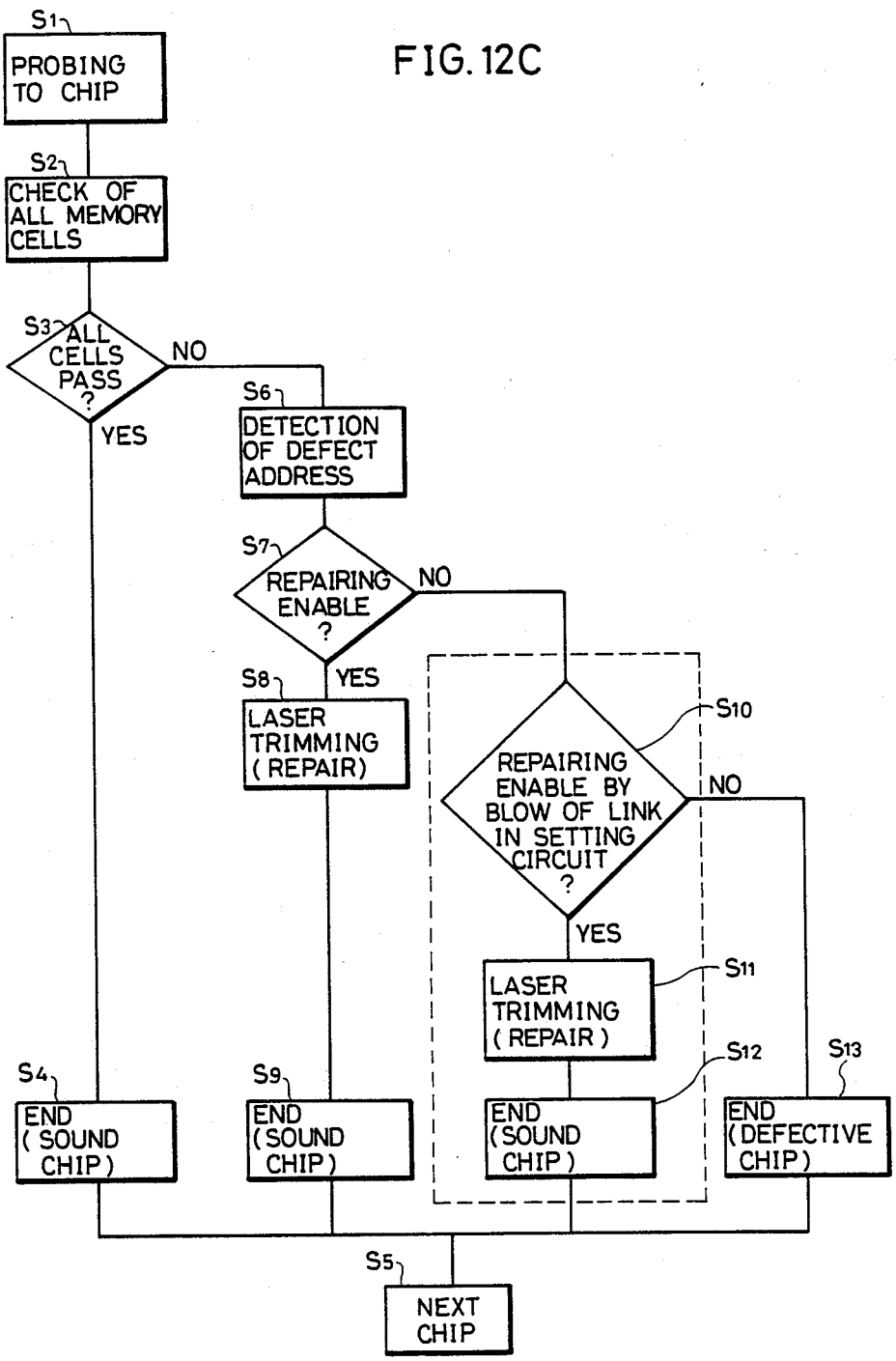
FIG. 12C shows a flow chart for explaining an operation of the system of FIG. 12B.

FIG. 12B shows a system for automated defect detection and repair of the above described semiconductor memory device. FIG. 12C shows a flow chart for explaining an operation of the system.

Referring to FIGS. 12B and 12C, a semiconductor chip 23 is probed by a probe card 101 (the step S1). All memory cells in the semiconductor chip 23 are checked by a memory tester 102 (the step S2). When all memory cells are passed (the step S3), the semiconductor chip 23 is regarded as a sound chip (the step S4) and a check of the next chip is performed (the step S5). When any of memory cells is defective (the step S3), a defect address is detected by the memory tester 102 (the step S6).

It is determined whether the defect can be repaired or not by replacing a row decoder corresponding to the defect with a spare decoder (the step S7). When the defect can be repaired, the row decoder is disabled and the spare decoder is enabled by blowing off linking devices using a laser trimmer 103 (the step S8). In this manner, the semiconductor chip 23 can be regarded as a sound chip (the step S9).

In the step S7, it is determined that the defect cannot be repaired, then it is determined whether or not the defect can be repaired by blowing off the link device LN23 of the setting circuit 35 (the step S10). If the defect can be repaired by blowing off the link device LN23, the link device LN23 is blown off by the laser trimmer 103 and the row decoder is disabled while the spare decoder is enabled by blowing off the linking devices using the laser trimmer 103 (the step S11). In this manner, the semiconductor chip 23 can be regarded as a sound chip (the step S12).

If the defect cannot be repaired by blowing off the link device LN23, the semiconductor chip 23 is regarded as a defect chip (the step S13).

Figure 14:
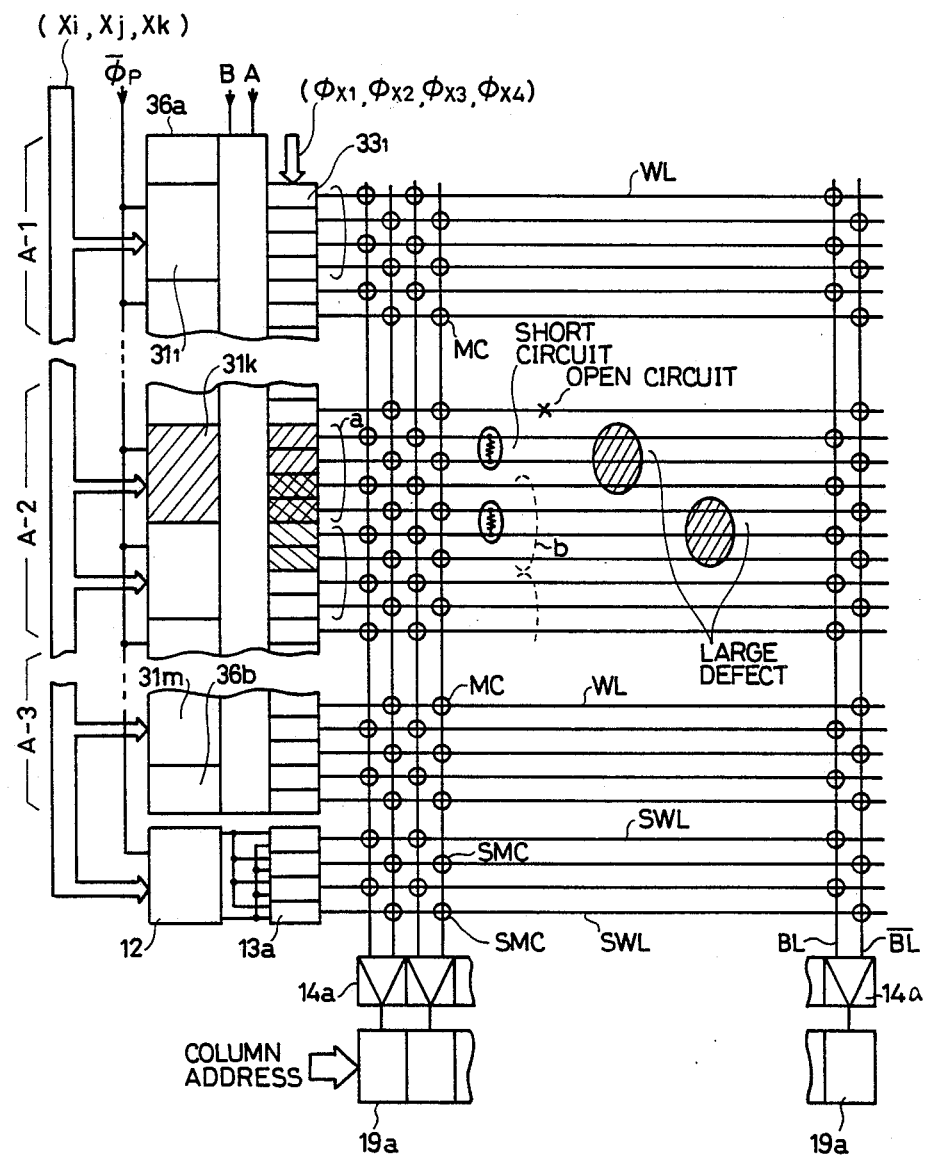
FIG. 14 shows various defects which can be repaired by the embodiments shown in FIGS. 9 to 13.

FIG. 14 shows various defects which can be repaired by the semiconductor memory device in accordance with the present embodiment.

In this semiconductor memory device, the snapping of the word line WL, the short circuit between two word lines WL and a large defect over three word lines WL can be repaired by replacing one row decoder $31_k$ with one spare row decoder 12.

Figure 15A:
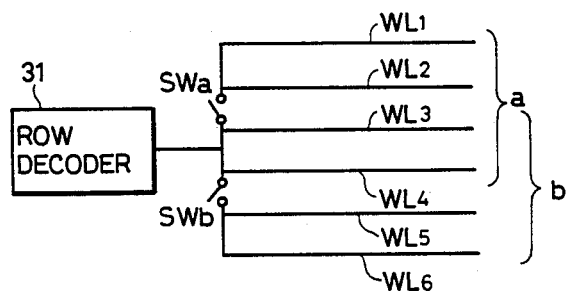
FIG. 15A schematically shows the embodiments shown in FIGS. 9 to 13.
Figure 15B:
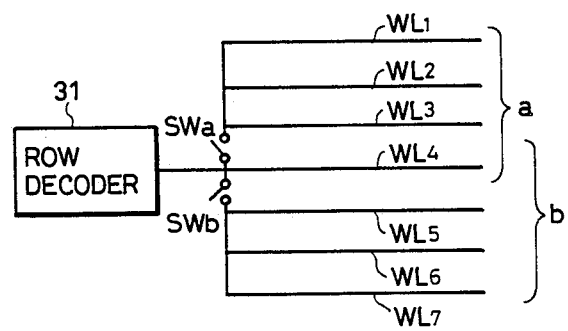
FIG. 15B schematically shows another embodiment of the present invention.

FIG. 15A schematically shows the above described embodiment. Namely, in the above described embodiment, the row decoder 31 is coupled to the set a of the word line $WL_1$ to $WL_4$ by turning on the switch SWa and turning off the switch SWb, while the row decoder 31 is coupled to the set b of the word lines $WL_3$ to $WL_6$ by turning off the switch SWa and turning on the switch SWb. However, the state of coupling of the row decoder and the word lines are not limited to the above embodiment. For example, as shown in FIG. 15B, the row decoder 31 may correspond to the set a of the word lines $WL_1$ to $WL_4$ by turning on the switch SWa and turning off the switch SWb, and the row decoder 31 may be coupled to the set b of the word line $WL_4$ to $WL_7$ by turning off the switch SWa and turning on the switch SWb. It should be noted that when the total number of the decoder is m and each decoder is coupled to n drivers, the total number of the drivers will be more than $2mn+n$ except the spare drivers.

Figure 16:
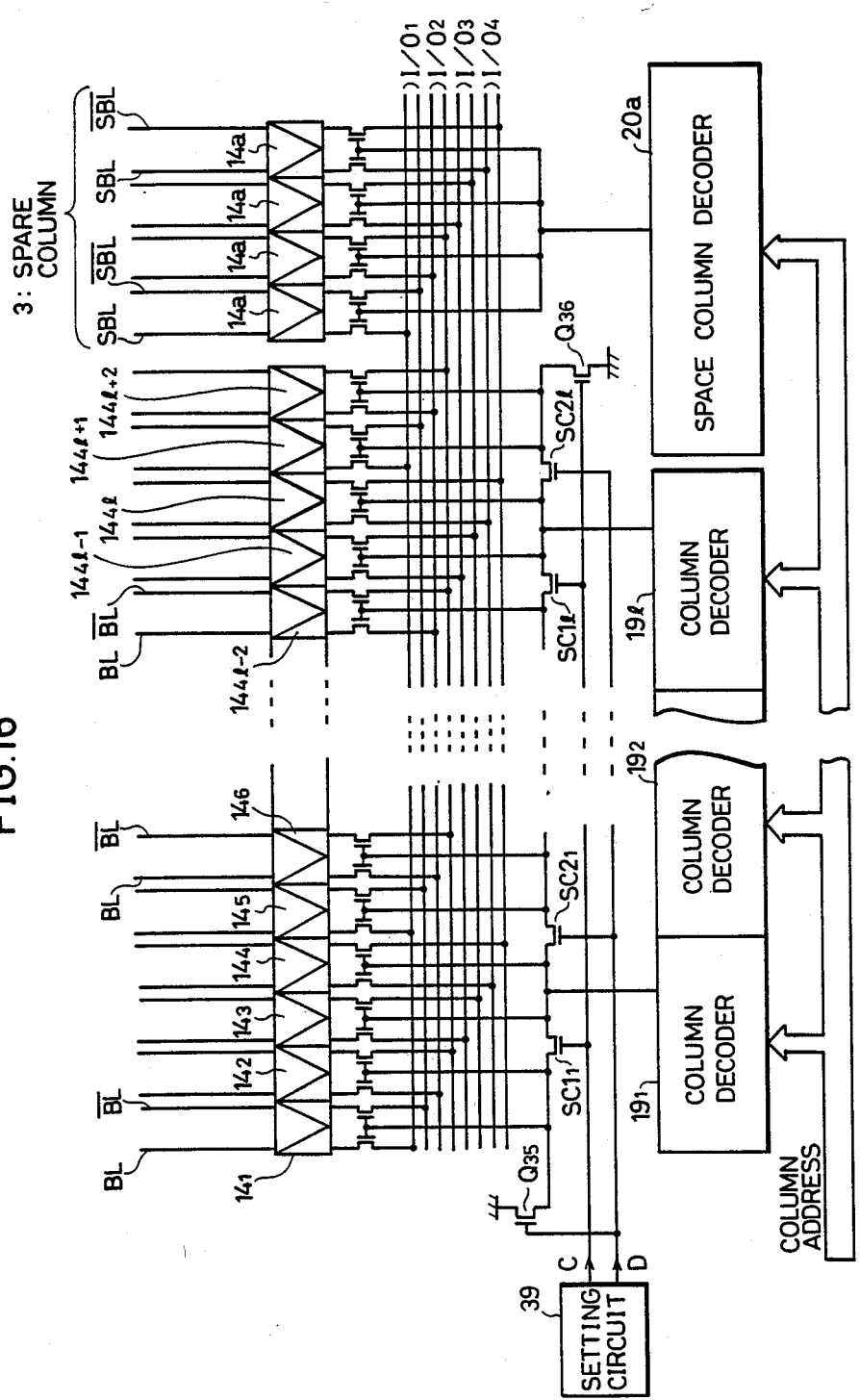
FIG. 16 shows and embodiment of the present invention applied to a column decoder.

FIG. 16 shows an embodiment in which the present invention is applied to a column decoder.

When the setting signal C from a setting circuit 39 is at the "H" level and a setting signal D is at the "L" level, the first N channel MOS transistors $SC1_1$ $SC1_l$ turn on while the second N channel MOS transistors $SC2_1$ to $SC2_l$ turn off. Consequently, each column decoder $19_k$ is coupled to the sense amplifiers $14_{4k-3}$ to $14_{4k}$. Here, k is an integer from 1 to l. On this occassion, the N channel MOS transistor Q35 turns off and the N channel MOS transistor Q36 turns on, so that the sense amplifiers $14_{4l+1}$ and $14_{4l+2}$ are respectively separated from the I/O line repair $I/O_1$ and $I/O_2$. Therefore, when the column decoder $19_k$ is replaced with the spare column decoder 20a, four sense amplifiers 14a and four sets of spare bit line pairs SBL, $\overline{SBL}$ connected thereto are selected instead of the corresponding sense amplifiers $14_{4k-3}$ to $14_{4k}$ and four sets of bit line pairs BL, $\overline{BL}$ connected thereto. The structure of the setting circuit 39 is the same as that of the setting circuit 35 shown in FIG. 12.

On the contrary, when the setting signal C from the setting circuit 39 is at the "L" level and the setting signal D is at the "H" level, the first N channel MOS transistors $SC1_1$ to $SC1_l$ turn off while the second N channel MOS transistors $SC2_1$ to $SC2_l$ turn on. Consequently, each column decoder $19_k$ is coupled to the sense amplifiers $14_{4k-1}$ to $14_{4k+2}$. On this occassion, since the N channel MOS transistor Q35 turns on and the N channel MOS transistor Q36 turns off, the sense amplifiers $14_1$ and $14_2$ are respectively separated from the I/O line pair $I/O_1$ and $I/O_2$. Therefore, when the column decoder $19_k$ is replaced with a spare column decoder 20a, four sense amplifiers 14a and four sets of spare bit line pairs SBL, $\overline{SBL}$ are selected instead of the corresponding sense amplifiers $14_{4k-1}$ to $14_{4k+2}$ and the four sets of bit line pairs BL, $\overline{BL}$ connected thereto.

In this manner, in the above described embodiment, not only the snapping bit lines BL, $\overline{BL}$ and a short circuit between two sets of bit line pairs BL and $\overline{BL}$ but also a large defect over three sets of bit line pairs BL, $\overline{BL}$ can be compensated for replacing one column decoder $19_k$ with one spare column decoder 20a.

Although four word lines or four bit line pairs are selected by one decoder in the above described embodiments, the present invention is not limited to that and it can be applied when eight word lines or eight sets of bit line pairs are selected by one deconder, and so on.

As described above, according to the present invention, since the state of coupling between each selection means and a plurality of selection lines can be changed by the switching means, the defects which can not be repaired by a one spare selection means can be repaired by one spare selection means, so that a semiconductor memory device of high production yield can be obtained.

The present invention can be applied to not only a dynamic random access memory (DRAM) but also a static random access memory (SRAM), and erasable and programmable read only memory (EPROM), a programmable logic array, AI processor and so on.

According to the present invention, semiconductor devices wherein various defects therein detected during manufacture can be corrected is provided.

In addition, improved circuit redeundancy within programmable arrays of semiconductor components, wherein large defects can be corrected is provided.

Furthermore, within a programmable array of semiconductor components that can be addressed by line decoders each for selecting among a predetermined number of signal lines, improved circuit redundancy wherein short circuits between signal lines of different line decoders can be corrected is provided.

Furthermore, circuit redundancy within semiconductor memory arrays, wherein the group of word lines belonging to a row decoder to be replaced by a spare decoder can be varied is provided.

Furthermore, within a semiconductor memory device of a type having an array of memory cells arranged at intersections of bit lines and word lines, wherein row decoders select among predetermined numbers of different word lines and column decoders select among predetermined numbers of different bit line, improved circuit redundancy wherein short circuits between word lines of different row decoders can be corrected is provided.

Furthermore, production yield of semiconductor device arrays by correcting various defects produced in the process of manufacturing the arrays in substantially enhanced.

Furthermore, improved circuit redundancy within semiconductor dynamic random access memories is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a programmable redundant circuit, comprising:
   a plurality of selection lines being divided into a plurality of first sets each comprising a prescribed plurality of selection lines, and divided into a plurality of second sets each comprising a prescribed plurality of selection lines;
   a plurality of spare selection lines;
   a plurality of memory cells each of which is connected to any of said plurality of selection lines; a plurality of spare memory cells each of which is connected to any of said plurality of spare selection lines;
   a plurality of selection means, each being selectively coupled to the plurality of selection lines of each of said first sets or to the plurality of selection lines of each of said second sets and being activated in response to a prescribed selection signal for selecting the plurality of selection lines of each of said first sets or the plurality of selection lines of each of said second sets;
   spare selection means coupled to said plurality of spare selection lines and being activated instead of any of said selection means to select said plurality of spare selection lines; and
   switching means which selectively couples each of said selection means to the plurality of selection lines of each of said first sets or to the plurality of selection lines of each of said second sets at the time of said selection.

2. A semiconductor memory device according to claim 1, wherein said switching means comprised:
   setting means for selectively generating a first setting signal and a second setting signal;
   first switch means responsive to said first setting signal for coupling each of said selection means to the plurality of selection lines of each corresponding one of said first sets; and
   second switch means responsive to said second setting signal for coupling each of said selection means to the plurality of selection lines of each corresponding one of said second sets.

3. A semiconductor memory device according to claim 2, wherein
   said setting means comprises first linking means which can be cut, said setting means generating said first setting signal when said linking means is not cut and generating said second setting signal when said linking means is cut.

4. A semiconductor memory device according to claim 3, wherein
   said first setting signal is at a first logic level; and
   said second setting signal is at a seond logic level which is different from said first logic level.

5. A semiconductor memory device according to claim 3, wherein
   said selection means comprises a second linking means which can be cut and said selection means can be fixedly inactivated beforehand dependent on whether the second linking means is cut or not; and
   said spare selection means comprises a plurality of third linking means which can be cut, and is activated, by previously cutting any of the plurality of third linking means in response to said selection signal corresponding to said selection means which is fixedly inactivated.

6. A semiconductor memory device according to claim 5, wherein
   said first, second and third linking means comprises a linking device which can be blown out by a laser beam.

7. A semiconductor memory device according to claim 2, wherein
   the number of said plurality of selection means in m, where m is a positive integer;
   the number of said selection lines connected to each of said selection means in 2n, where n is a positive integer; and
   the total number of said plurality of selection lines is no less than 2mn+n.

8. A semiconductor memory device according to claim 7, which further comprises:
   first clamp means which fixedly inactivates a selection line which is not coupled to any selection means when said first switch means is in operation; and
   second clamp means which fixedly inactivates a selection line which is not coupled to any selection means when said second switch means is in operation.

9. A semiconductor memory device according to claim 6, wherein
   said first clamp means operates in response to said first setting signal; and
   said second clamp means operates in response to said second setting signal.

10. A semiconductor memory device having a programmable redundant circuit, comprising:

a plurality (no less than 2mn+n) of word lines, where m and n are positive integers;

2n spare word lines;

a plurality of memory cells each of which is connected to any of said plurality of word lines;

a plurality of spare memory cells each of which is connected to any of said 2n spare word lines;

a plurality of word drivers each of which is connected to each of said word lines, wherein said plurality of word drivers are divided into a plurality (m) of first sets each comprising 2n word drivers and are divided into a plurality (m) of second sets each comprising 2n word drivers;

2n spare word drivers each of which is coupled to each of said spare word lines;

m row decoders each of which selects 2n of said word drivers;

a spare row decoder connected to said 2n spare word drivers for selecting said 2n spare word drivers;

first selection signal generation means for generating a first selection signal;

setting means for selectively generating a first setting signal or a second setting signal;

first switch group responsive to said first setting signal for coupling each of said row decoders to 2n word drivers in each of said first sets;

first clamp means responsive to said first setting signal for fixedly inactivating said word driver which is not coupled to any of said row decoders;

second switch group responsive to said second setting signal for coupling each of said row decoders to 2n word drivers of each of said second sets;

second clamp means responsive to said second setting signal for fixedly inactivating said word driver which is not coupled to any of said row decoders; wherein each of said row decoders selects said corresponding 2n word drivers in response to the corresponding said first selection signal from said first selection signal generation means; and said spare row decoder selects said 2n spare word drivers in response to said corresponding first selection means from said first selection signal generation means instead of any of said row decoders.

11. A semiconductor memory device according to claim 10, which further comprises:

second selection signal generation means for generating a second selection signal; and a subdecoder responsive to said second selection signal for activating any one of said 2n word drivers selected by said row decoders.

12. A semiconductor memory device according to claim 11, wherein said setting means comprises a linking device which can be cut, said setting means generating said first setting signal when said linking device is not cut and generating said second setting signal when said linking device is cut.

13. A semiconductor memory device according to claim 10, wherein each of said row decoder comprises a linking device which can be cut, and can be fixedly set at the inactive state dependent on whether the linking device is cut or not; and said spare row decoder comprises a plurality of linking devices which can be cut, and selects, by cutting any of the plurality of linking devices said 2n spare word drivers in response to said first selection signal corresponding to said row decoder which is fixedly inactivated.

14. A semiconductor memory device having a programmable redundant circuit, comprising:

a plurality (no less than 2mn+n) sets of bit line pairs, where m and n are positive integer;

2n sets of spare bit line pairs;

a plurality of memory cells each of which is connected to any of said plurality of bit lines;

a plurality of spare memory cells each of which is connected to any of said plurality of spare bit lines;

a plurality of sense amplifiers each of which is connected to each of said bit line pairs, wherein said plurality of sense amplifiers are divided into a plurality (m) of first sets each comprising 2n sense amplifiers and are divided into a plurality (m) of second sets each comprising 2n sense amplifiers;

a plurality of spare sense amplifiers each of which is coupled to each of said spare bit line pairs;

m column decoders each of which selects 2n of said sense amplifiers;

a spare column decoder from selecting said 2n spare sense amplifiers;

setting means for selectively generating a first setting signal or a second setting signal;

a first switch group responsive to said first setting signal for coupling each of said column decoders to 2n sense amplifiers of each of said first sets;

first clamp means responsive to said first setting signal for fixedly inactivating said sense amplifier which is not coupled to any of said column decoders;

a second switch group responsive to said second setting signal for coupling each of said column decoders to 2n sense amplifiers of each of said second sets;

second clamp means responsive to said second setting signal for fixedly inactivating said sense amplifier which is not coupled to any of said column decoders;

selection signal generation means for generating a selection signal; wherein each of said colunm decoders selects said corresponding 2n sense amplifiers in response to said corresponding selection signal from said selection signal generation means; and said spare column decoder selects said 2n spare sense amplifiers in response to sad corresponding selection signal from said selection signal generation means instead of any of said column decoders.

15. A semiconductor memory device according to claim 14, wherein said setting means comprises a linking device which can be cut, generating said first setting signal when said linking device is not cut and generating said second setting signal when said linking device is cut.

16. A semiconductor memory device according to claim 14, wherein each of said column decoders comprises a linking device which can be cut, and can be fixedly set at an inactivated state dependent on whether the linking device is cut or not; and said spare column decoder comprises a plurality of linking devices which can be cut and selects, by cutting any of the plurality of linking devices said 2n spare sense amplifiers in response to said selection signal corresponding to said column decoder which is fixedly inactivated.

17. A system for repairing defects in a semiconductor device formed of an array of semiconductor components arranged at intersections of rows and columns, and including pluralities of address decoder means for selecting said components in response to external row and colunm address signals, each decoder means connected to a different group of address lines, and redundant circuit means comprising a spare decoder means, a plurality of spare address lines connected to said spare decoder means, and a plurality of spare semiconductor components connected to said plurality of spare address lines, comprising:

means for testing said semiconductor device to detect defects therein;
   means for identifying particular decoder means associated with said defects;
   means for determining whether said defects detected during said measuring step extend between address lines connected to different particular decoder means, and, in response;
   means for changing the group of address lines connected to said one of said particular decoder means; and
   means for replacing said one of said particular decoder means by said spare decoder means.

18. In a semiconductor device formed of an array of semiconductor components arranged at intersections of rows and columns, and including pluralities of address decoder means for selecting said components in response to external row and column address signals, each decoder means connected to a different group of address lines, and redundant circuit means comprising a spare decoder means, a plurality of spare address lines connected to said spare decoder means, and a plurality of spare semiconductor components connected to said plurality of spare address lines;

a method of correcting defects in said semiconductor device, comprising the steps of:
   (a) testing said semiconductor device to detect defects therein;
   (b) identifying particular decoder means associated with said defects;
   (c) determining whether said defects detected during said measuring step extend between address line connected to different particular decoder means, and, in response;
   (d) changing the group of address lines connected to said one of said particular decoder means; and
   (e) replacing said one of said particular decoder means by said spare decoder means.

* * * * *